(12) United States Patent
Verma et al.

(10) Patent No.: US 10,481,233 B2
(45) Date of Patent: Nov. 19, 2019

(54) EDEMA INVARIANT TRACTOGRAPHY

(71) Applicant: The Trustees of the University of Pennsylvania, Philadelphia, PA (US)

(72) Inventors: Ragini Verma, Philadelphia, PA (US); Luke Macyszyn, Philadelphia, PA (US); Emmanuel Caruyer, Rennes (FR); Jeremy Lecoeur, Philadelphia, PA (US); Mark Elliot, Bryn Mawr, PA (US); Steven Brem, Haverford, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 67 days.

(21) Appl. No.: 15/509,402

(22) PCT Filed: Sep. 8, 2015

(86) PCT No.: PCT/US2015/048844
§ 371 (c)(1),
(2) Date: Mar. 7, 2017

(87) PCT Pub. No.: WO2016/040260
PCT Pub. Date: Mar. 17, 2016

(65) Prior Publication Data
US 2017/0285124 A1    Oct. 5, 2017

Related U.S. Application Data

(60) Provisional application No. 62/047,980, filed on Sep. 9, 2014.

(51) Int. Cl.
*G01V 3/00* (2006.01)
*G01R 33/563* (2006.01)
*G01R 33/56* (2006.01)

(52) U.S. Cl.
CPC ... *G01R 33/56341* (2013.01); *G01R 33/5608* (2013.01)

(58) Field of Classification Search
USPC .......................................................... 324/309
See application file for complete search history.

(56) References Cited

U.S. PATENT DOCUMENTS 7,022,077 B2 *   4/2006   Mourad ............... A61B 5/0048
                                                         600/449
8,076,937 B2    12/2011   Holthuizen et al.
(Continued)

FOREIGN PATENT DOCUMENTS

WO    WO 2014-052782 A1    4/2014
WO    WO 2016-040260 A1    3/2016

OTHER PUBLICATIONS

Assaf, Yaniv, and Peter J. Basser. "Composite hindered and restricted model of diffusion (CHARMED) MR imaging of the human brain." *Neuroimage* 27, No. 1 (Aug. 2005): 48-58.
(Continued)

*Primary Examiner* — Rodney E Fuller
(74) *Attorney, Agent, or Firm* — Howson and Howson LLP; Cathy A. Kodroff

(57) ABSTRACT

Edema invariant tractography methods are provided. The methods include acquiring data using a multishell, high angular resolution diffusion imaging sequence; (ii) modeling the data using a multi-compartment model; and (iii) reconstructing the fibers through a probabilistic tracking algorithm using a fiber orientation distribution which has streamlines fitted to the output of said probabilistic tracking algorithm.

34 Claims, 10 Drawing Sheets

(56) References Cited

U.S. PATENT DOCUMENTS

| | | | |
|---|---|---|---|
| 2007/0016451 A1 | 1/2007 | Tilson | |
| 2012/0280686 A1 | 11/2012 | White et al. | |
| 2013/0278257 A1* | 10/2013 | Boada | G01R 33/561 324/309 |
| 2014/0294270 A1* | 10/2014 | Schneider | A61B 5/055 382/131 |
| 2015/0253410 A1* | 9/2015 | Warfield | A61B 5/055 324/309 |
| 2016/0231410 A1* | 8/2016 | Warfield | A61B 5/055 |

OTHER PUBLICATIONS

Basser et al., "Estimation of the effective self-diffusion tensor from the NMR spin echo," Journal of Magnetic Resonance, Series B, vol. 103, pp. 247-254, Mar. 1994.

Basser et al., "MR diffusion tensor spectroscopy and imaging," Biophysical Journal, vol. 66, pp. 259-267, Jan. 1994.

Behrens, T. E. J., M. W. Woolrich, M. Jenkinson, H. Johansen-Berg, R. G. Nunes, S. Clare, P. M. Matthews, J. M. Brady, and S. M. Smith. "Characterization and propagation of uncertainty in diffusion-weighted MR imaging." *Magnetic Resonance in Medicine* 50, No. 5 (Oct. 2003): 1077-1088.

J. I. Berman, M. S. Berger, S. W. Chung, S. S. Nagarajan, and R. G. Henry, "Accuracy of diffusion tensor magnetic resonance imaging tractography assessed using intraoperative subcortical stimulation mapping and magnetic source imaging." Journal of neurosurgery, vol. 107, No. 3, pp. 488-494, Sep. 2007.

Ojemann et al., Diffusion MRI of the Cervical Cord. The American Association of Neurological Surgeons 1998 Annual Meeting. Apr. 1998. http://neurosurgery.mgh.harvard.edu/docs/AANS98poster.pdf.

Descoteaux, "High Angular Resolution Diffusion MRI: from Local Estimation to Segmentation and Tractography," INRIA Sophia Antipolis, Feb. 2008.

Gooya et al., "GLISTR: Glioma Image Segmentation and Registration," IEEE Trans Med Imaging, vol. 31, pp. 1941-1954, Oct. 2012.

Y. Ou, A. Sotiras, N. Paragios, and C. Davatzikos, "DRAMMS: Deformable registration via attribute matching and mutual-saliency weighting." Medical image analysis, vol. 15, No. 4, pp. 622-639, Aug. 2011.

Tournier et al., "Resolving crossing fibres using constrained spherical deconvolution: validation using diffusion-weighted imaging phantom data," Neuroimage, vol. 42, pp. 617-625, Aug 2008.

Tuch, "Diffusion MRI of Complex Tissue Structure," Harvard University and Massachusetts Institute of Technology, Jan. 2002.

Basser, "Microstructural and physiological features of tissues elucidated by quantitative-diffusion-tensor MRI," Journal of Magnetic Resonance, Series B, vol. 111, pp. 209-219, Jun. 1996.

Basser et al., "In vivo fiber tractography using DT-MRI data," Magnetic Resonance in Medicine, vol. 44, pp. 625-632, Oct. 2000.

Bihan et al., "Diffusion MRI at 25: Exploring brain tissue structure and function," Neuroimage, Nov. 2011.

Abdullah et al., "Use of diffusion tensor imaging in glioma resection," Neurosurgical focus, vol. 34, p. E1, Apr. 2013.

Golby et al., "Interactive diffusion tensor tractography visualization for neurosurgical planning," Neurosurgery, vol. 68, pp. 496-505, Feb. 2011.

Nimsky, "Preoperative and intraoperative diffusion tensor imaging-based fiber tracking in glioma surgery," Neurosurgery, vol. 61, pp. 178-185; discussion 186, Jan. 2007.

Nimsky et al., "Fiber Tracking—We Should Move Beyond Diffusion Tensor Imaging," World neurosurgery, vol. 82, Issues 1-2, Jul.-Aug. 2014, pp. 35-36.

Duffau, "The dangers of magnetic resonance imaging diffusion tensor tractography in brain surgery," World neurosurgery, vol. 81, pp. 56-58, Jan. 2014.

Lerner et al., "Clinical Applications of Diffusion Tensor Imaging," World Neurosurg, Aug. 3, 2013.

Nimsky et al., "Multimodal navigation integrated with imaging," Acta neurochirurgica. Supplement, vol. 109, pp. 207-214, 2011.

American Brain Tumor Society, http://www.abta.org/about-us/news/brain-tumor-statistics/, last updated Jan. 2017.

Sawaya et al., "Neurosurgical outcomes in a modern series of 400 craniotomies for treatment of parenchymal tumors," Neurosurgery, vol. 42, pp. 1044-1055; discussion 1055-6, May 1998.

Ganslandt et al., "Neuronavigation: concept, techniques and applications," Neurology India, vol. 50, pp. 244-255, Sep. 2002.

Tsolaki et al., "Clinical decision support systems for brain tumor characterization using advanced magnetic resonance imaging techniques," World journal of radiology, vol. 6, pp. 72-81, Apr. 2014.

Winston et al., "Diffusion tensor imaging tractography to visualize the relationship of the optic radiation to epileptogenic lesions prior to neurosurgery," Epilepsia, vol. 52, pp. 1430-1438, Aug. 2011.

Yamada et al., "MR tractography: a review of its clinical applications," Magnetic resonance in medical sciences : MRMS : an official journal of Japan Society of Magnetic Resonance in Medicine, vol. 8, pp. 165-167 4, Dec. 2009.

Buchmann et al., "Utility of diffusion tensor-imaged (DTI) motor fiber tracking for the resection of intracranial tumors near the corticospinal tract," Acta neurochirurgica, vol. 153, pp. 68-74; discussion 74, Jan. 2011.

Bucci et al., "Quantifying diffusion MRI tractography of the corticospinal tract in brain tumors with deterministic and probabilistic methods," Neuroimage. Clinical, vol. 3, pp. 361-368, Aug. 2013.

Bello et al., "Motor and language DTI Fiber Tracking combined with intraoperative subcortical mapping for surgical removal of gliomas," Neuroimage, vol. 39, pp. 369-382, Jan. 2008.

Fernandez-Miranda et al., "High-definition fiber tractography of the human brain: neuroanatomical validation and neurosurgical applications," Neurosurgery, vol. 71, pp. 430-453, Aug. 2012.

Clark et al., "White matter fiber tracking in patients with space-occupying lesions of the brain: a new technique for neurosurgical planning," Neuroimage, vol. 20, pp. 1601-1608, Nov. 2003.

Zhang et al., "Automated fiber tracking of human brain white matter using diffusion tensor imaging," Neuroimage, vol. 42, pp. 771-717, Aug. 2008.

Feigl et al., "Magnetic resonance imaging diffusion tensor tractography: evaluation of anatomic accuracy of different fiber tracking software packages," World Neurosurgery, vol. 81, pp. 144-150, Jan. 2014.

Smith et al., "Role of extent of resection in the long-term outcome of low-grade hemispheric gliomas," Journal of clinical oncology, vol. 26, pp. 1338-1345, Mar. 2008.

Sanai et al., "Glioma extent of resection and its impact on patient outcome," Neurosurgery, vol. 62, pp. 753-764; discussion 264-6, Apr. 2008.

McGirt et al., "Independent association of extent of resection with survival in patients with malignant brain astrocytoma," Journal of neurosurgery, vol. 110, pp. 156-162, Jan. 2009.

Oppenlander et al., "An extent of resection threshold for recurrent glioblastoma and its risk for neurological morbidity," Journal of neurosurgery, vol. 120, pp. 846-853, Apr. 2014.

Marina et al., "Treatment outcomes for patients with glioblastoma multiforme and a low Karnofsky Performance Scale score on presentation to a tertiary care institution. Clinical article," Journal of neurosurgery, vol. 115, pp. 220-229, Aug. 2011.

Castellano et al., "Role of diffusion tensor magnetic resonance tractography in predicting the extent of resection in glioma surgery," Neurooncology, vol. 14, pp. 192-202, Feb. 2012.

Wu et al., "Clinical evaluation and follow-up outcome of diffusion tensor imaging-based functional neuronavigation: a prospective, controlled study in patients with gliomas involving pyramidal tracts," Neurosurgery, vol. 61, pp. 935-948; discussion 948-9, Nov. 2007.

Girard et al., "Neurosurgical tracking at the Sherbrooke Connectivity Imaging Lab (SCIL)," presented at the MICCAI DTI Tractography Challenge, 2012.

Kuhnt et al., "Optic radiation fiber tractography in glioma patients based on high angular resolution diffusion imaging with compressed sensing compared with diffusion tensor imaging—initial experience," PloS One, vol. 8, Jul. 2013.

(56) References Cited

OTHER PUBLICATIONS

Duffau, "Diffusion Tensor Imaging Is a Research and Educational Tool, but Not Yet a Clinical Tool," World Neurosurgery, Jul. 2014.
Farquharson et al., "White matter fiber tractography: why we need to move beyond DTI," Journal of Neurosurgery, vol. 118, pp. 1367-1377, Jun. 2013.
Caruyer et al., "A comparative study of 16 tractography algorithms for the corticospinal tract reproducibility and subject-specificity," in ISMRM, May 2014.
Wang et al., "A comprehensive reliability assessment of quantitative diffusion tensor tractography," Neuroimage, vol. 60, pp. 1127-1138, Apr. 2012.
Bihan et al., "Artifacts and pitfalls in diffusion MRI," Journal of magnetic resonance imaging, vol. 24, pp. 478-488, Sep. 2006.
Pasternak et al., "Estimation of extracellular volume from regularized multi-shell diffusion MRI," presented at the Med Image Comput Comput Assist Interv. MICCAI, 2012.
Zhang et al., "NODDI: practical in vivo neurite orientation dispersion and density imaging of the human brain," Neuroimage, vol. 61, pp. 1000-1016, Jul. 2012.
Pasternak et al., "Free water elimination and mapping from diffusion MRI," Magnetic resonance in medicine, vol. 62, pp. 717-730, Sep. 2009.
Scherrer et al., "Characterizing the distribution of anisotropic microstructural environments with diffusion-weighted imaging (DIAMOND)," Medical image computing and computer-assisted intervention : MICCAI . . . International Conference on Medical Image Computing and Computer-Assisted Intervention, vol. 16, pp. 518-526, Sep. 2013.
Fedorov et al., "3D Slicer as an image computing platform for the Quantitative Imaging Network," Magnetic Resonance Imaging, vol. 30, pp. 1323-1341, Nov. 2012.
Augustinack et al., "Predicting the location of human perirhinal cortex, Brodmann's area 35, from MRI", NeuroImage 64(Jan. 2013), 32-42.
Tournier et al., "MRtrix: Diffusion tractography in crossing fiber regions," International Journal of Imaging Systems and Technology, vol. 22, pp. 53-66, Mar. 2012.
Cook et al., "Camino: Open-Source Diffusion-MRI Reconstruction and Processing," in Scientific Meeting of the International Society for Magnetic Resonance in Medicine, ed, 2006, p. 2759.
Xu et al., "Evaluation of slice accelerations using multiband echo planar imaging at 3 T," Neuroimage, vol. 83, pp. 991-1001, Dec. 2013.
Tuch et al., "Diffusion MRI of complex neural architecture," Neuron, vol. 40, pp. 885-895, Dec. 4, 2003.
Tuch, "Q-ball imaging," Magnetic Resonance in Medicine, vol. 52, pp. 1358-1372, Dec. 2004.
Tournier et al., "Direct estimation of the fiber orientation density function from diffusion-weighted MRI data using spherical deconvolution," Neuroimage, vol. 23, pp. 1176-1185, Nov. 2004.
Descoteaux et al., "Regularized, fast, and robust analytical Q-ball imaging," Magn Reson Med, vol. 58, pp. 497-510, Sep. 2007.
Descoteaux et al., "Diffusion propagator imaging: using Laplace's equation and multiple shell acquisitions to reconstruct the diffusion propagator," Inf Process Med Imaging, vol. 21, pp. 1-13, 2009.
Descoteaux et al., "Multiple q-shell diffusion propagator imaging," Medical Image Analysis, vol. 15, pp. 603-621, Aug. 2011.
Descoteaux et al., "Deterministic and probabilistic tractography based on complex fibre orientation distributions," IEEE Trans Med Imaging, vol. 28, pp. 269-286, Feb. 2009.
Bloy et al., "An integrated framework for hardi-based investigation of structural connectivity," Brain Connectivity, Apr. 2012, in press.
Tournier et al., "Robust determination of the fibre orientation distribution in diffusion MRI: non-negativity constrained super-resolved spherical deconvolution," Neuroimage, vol. 35, pp. 1459-1472, May 1, 2007.

Smith et al., "Anatomically-constrained tractography: improved diffusion MRI streamlines tractography through effective use of anatomical information," Neuroimage, vol. 62, pp. 1924-1938, Sep. 2012.
Caruyer et al., "Design of multishell sampling schemes with uniform coverage in diffusion MRI," Magnetic resonance in medicine, vol. 69, pp. 1534-1540, Jun. 2013.
Scherrer et al., "Why multiple b-values are required for multi-tensor models. Evaluation with a constrained log-Euclidean model," Proc. IEEE Int Biomedical Imaging: From Nano to Macro Symp, pp. 1389-1392, Apr. 2010.
Peng et al., "Feature selection based on mutual information criteria of max-dependency, max-relevance, and min-redundancy," IEEE Transactions on Pattern Analysis and Machine Intelligence vol. 27, pp. 1226-1238, Jun. 2005.
Roine et al., "Isotropic non-white matter partial volume effects in constrained spherical deconvolution," Frontiers in neuroinformatics, vol. 8, p. 28, Mar. 2014.
Dell'acqua et al., "A modified damped Richardson-Lucy algorithm to reduce isotropic background effects in spherical deconvolution," Neuroimage, vol. 49, pp. 1446-1458, Jan. 2010.
Lecoeur et al., "Improving White Matter Tractography by Resolving the Challenges of Edema," in M/CCA/ workshop: OT/ Challenge 2013, Nagoya, Japan, Sep. 2013.
Yeatman et al., "Tract profiles of white matter properties: automating fiber-tract quantification," PloS one, vol. 7, p. e49790, Nov. 2012.
Mandelli et al., "Quantifying accuracy and precision of diffusion MR tractography of the corticospinal tract in brain tumors," Journal of Neurosurgery, vol. in press pp. 1-10, Aug. 2014.
Kim et al., "Awake craniotomy for brain tumors near eloquent cortex: correlation of intraoperative cortical mapping with neurological outcomes in 309 consecutive patients," Neurosurgery, vol. 64, pp. 836-845; discussion 345-6, May 2009.
Sanai et al., "Intraoperative stimulation techniques for functional pathway preservation and glioma resection," Neurosurgicalfocus, vol. 28, p. E1, Feb. 2010.
Jones et al., "White matter integrity, fiber count, and other fallacies: the do's and don'ts of diffusion MRI," Neuroimage, vol. 73, pp. 239-254, Jun. 2013.
Huttenlocher et al., "Comparing Images Using the Hausdorff Distance," IEEE Transactions on Pattern Analysis and Machine Intelligence, vol. 15, pp. 850-863, Sep. 1993.
Ostrom et al., "The epidemiology of glioma in adults: a "state of the science" review," Neuro-oncology, Jul. 2014.
Hentschel et al., "Optimizing outcomes with maximal surgical resection of malignant gliomas," Cancer control: journal of the Moffitt Cancer Center, vol. 10, pp. 109-114, Mar. 2003.
Sanai et al., "An extent of resection threshold for newly diagnosed glioblastomas," Journal of Neurosurgery, vol. 115, pp. 3-8, Jul. 2011.
Brem et al., "Central nervous system cancers," Natl Compr Cancer Netw, vol. 9, pp. 352-400, Apr. 2011.
Schonberg et al., "Characterization of displaced white matter by brain tumors using combined DTI and fMRI," Neuroimage, vol. 30, pp. 1100-1111, May 1, 2006.
Hendler et al., "Delineating gray and white matter involvement in brain lesions: three-dimensional alignment of functional magnetic resonance and diffusion-tensor imaging," Journal of neurosurgery, vol. 99, pp. 1018-1027, Dec. 2003.
Smits et al., "Incorporating functional MR imaging into diffusion tensor tractography in the preoperative assessment of the corticospinal tract in patients with brain tumors," American journal of neuroradiology, vol. 28, pp. 1354-1361, Aug. 2007.
Pierpaoli et al., "TORTOISE: an integrated software package for processing of diffusion MRI data," in ISMRM 18th annual meeting, Stockholm, Sweden May 2010.
Girard et al., "Towards quantitative connectivity analysis: reducing tractography biases," Neuroimage, vol. 98C, pp. 266-278, Sep. 2014.
Dice, "Measures of the Amount of Ecologic Association Between Species," Ecology, vol. 26, pp. 297-302, Jul. 1945.

(56) References Cited

OTHER PUBLICATIONS

Garyfallidis E, Brett M, Amirbekian B, Rokem A, van der Walt S, Descoteaux M, Nimmo-Smith I and Dipy Contributors (Feb. 2014). Dipy, a library for the analysis of diffusion MRI data. Frontiers in Neuroinformatics, vol. 8, No. 8.

Catani et al., "A diffusion tensor imaging tractography atlas for virtual in vivo dissections," Cortex, vol. 44, pp. 1105-1132, Sep. 2008.

Cote, "Tractometer: towards validation of tractography pipelines," Medical image analysis, vol. 17, pp. 844-857, Oct. 2013.

Raffelt et al., "Apparent Fibre Density: a novel measure for the analysis of diffusion-weighted magnetic resonance images," Neuroimage, vol. 59, pp. 3976-3994, Feb. 2012.

Chamberland et al., "Real-time multi-peak tractography for instantaneous connectivity display," Frontiers in neuroinformatics, vol. 8, p. 59, May 2014.

Girard et al., "Anatomical Tissue Probability Priors for Tractography," presented at the International Conference on Medical Image Computing and Computer Assisted Intervention (MICCAI'12), workshop on Computational Diffusion MRI (CDMRI'12), Oct. 2012.

Zimmer. (Feb. 2014) The new science of the brain. National Geographic. 36-57.

Descoteaux et al., "A Fast and Robust ODF Estimation Algorithm in Q-Ball Imaging," in 3rd IEEE International Symposium on Biomedical Imaging: Macro to Nano, 2006., ed: IEEE, Apr. 2006, pp. 81-84.

Staempfli et al., "Combining fMRI and DTI: a framework for exploring the limits of fMRI-guided DTI fiber tracking and for verifying DTI-based fiber tractography results," Neuroimage, vol. 39, pp. 119-126, Jan. 2008.

Brun et al., "Clustering Fiber Traces Using Normalized Cuts," Medical image computing and computer-assisted intervention : MICCAI . . . International Conference on Medical Image Computing and Computer-Assisted Intervention, vol. 3216/2004, pp. 368-375, Sep. 2004.

Liu et al., "Unsupervised Automatic White Matter Fiber Clustering Using a Gaussian Mixture Model," Proceedings of IEEE International Symposium on Biomedical Imaging, vol. 2012, pp. 522-525, May 2012.

Maddah et al., "A unified framework for clustering and quantitative analysis of white matter fiber tracts," Medical image analysis, vol. 12, pp. 191-202, Apr. 2008.

Wang et al., "Hierarchical fiber clustering based on multi-scale neuroanatomical features," in Proceedings of the 5th international conference on Medical imaging and augmented reality, ed: Springer-Verlag, Sep. 2010, pp. 448-456.

Wassermann et al., "Unsupervised white matter fiber clustering and tract probability map generation: applications of a Gaussian process framework for white matter fibers," Neuroimage, vol. 51, pp. 228-241, May 2010.

Tunc et al., "Multinomial probabilistic fiber representation for connectivity driven clustering," in Information Processing in Medical Imaging. Jun.-Jul. 2013, pp. 730-741.

Song et al., "Highly efficient incremental estimation of Gaussian mixture models for online data stream clustering," Intelligent Computing: Theory and Applications III, vol. 5803, pp. 174-183, 2005.

Desikan et al., "An Automated Labeling System for Subdividing the Human Cerebral Cortex on MRI Scans into Gyral Based Regions of Interest," Neuroimage, vol. 31, Jul. 2006.

O'Donnell et al., "A Method for Clustering White Matter Fiber Tracts," American Journal of Neuroradiology, vol. 27, pp. 1032-1036, May 1, 2006.

Reynolds et al., "Speaker verification using adapted Gaussian mixture models," Digital Signal Processing, vol. 10, pp. 19-41, Jan.-Jul. 2000.

Kuhn, "The Hungarian method for the assignment problem," Naval Research Logistics Quarterly, vol. 2, pp. 83-97, Mar. 1955.

Dowson et al., "The Frechet distance between multivariate normal distributions," Journal of Multivariate Analysis, vol. 12, pp. 450-455, Sep. 1982.

Tunc et al., "Automated extraction of fiber bundles for population studies," presented at the ISMRM, Milan, Italy, May 2014.

Behrens et al., "Probabilistic diffusion tractography with multiple fibre orientations: What can we gain," Neuroimage, vol. 34, pp. 144-155, Jan. 1, 2007.

Zacharaki et al., "Non-diffeomorphic registration of brain tumor images by simulating tissue loss and tumor growth," Neuroimage, vol. 46, pp. 762-774, Jul. 1, 2009.

Caruyer et al., "Rotation-invariant measures for population study in HARDI," in ISMRM, May 2014.

Ghosh et al., "Extracting geometrical features & peak fractional anisotropy from the ODF for white matter characterization," presented at the From Nano to Macro, 2011 IEEE International Symposium on Biomedical Imaging, Chicago, IL, Mar.-Apr. 2011.

International Search Report for Application No. PCT/US2015/048844, dated Dec. 3, 2015.

Written Opinion of the International Searching Authority for Application No. PCT/US2015/048844, dated Dec. 3, 2015.

\* cited by examiner

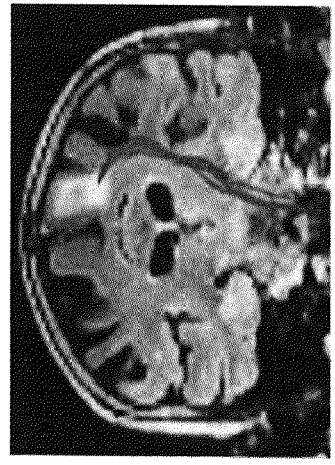
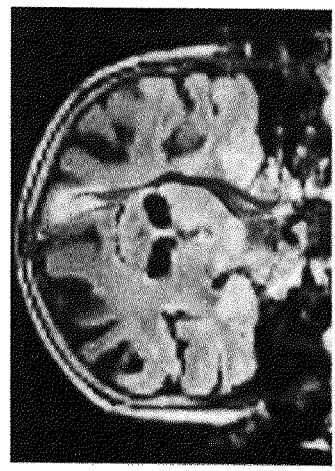
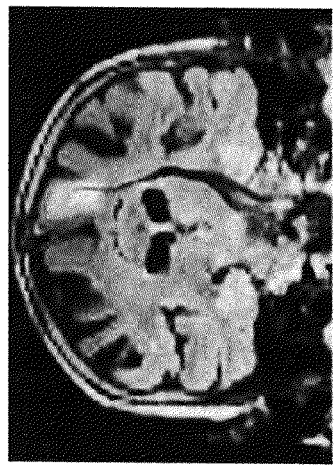
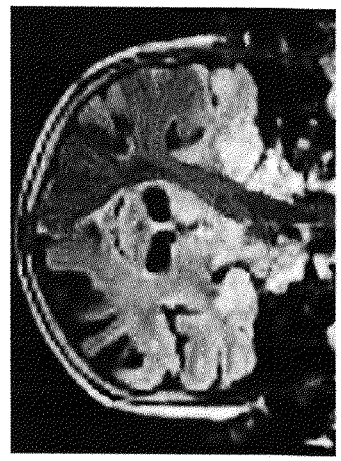
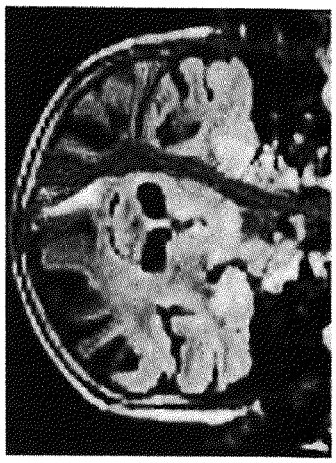

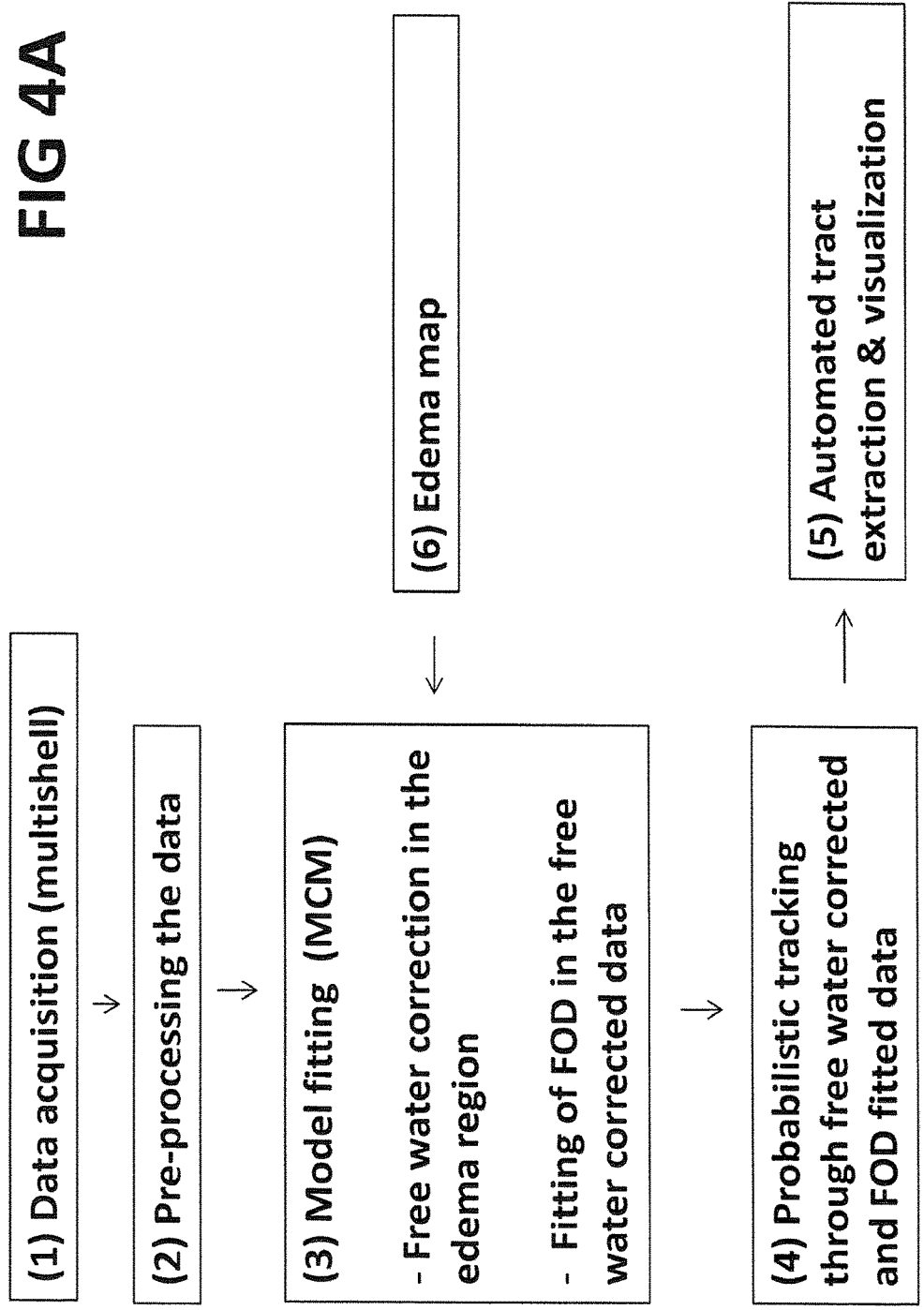

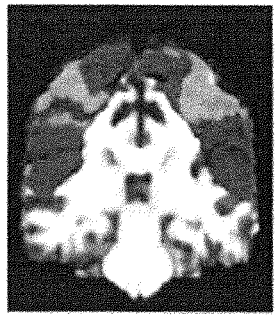 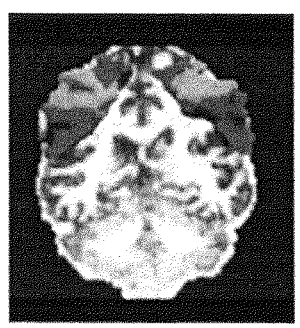 
FIG 6A   FIG 6B   FIG 6C
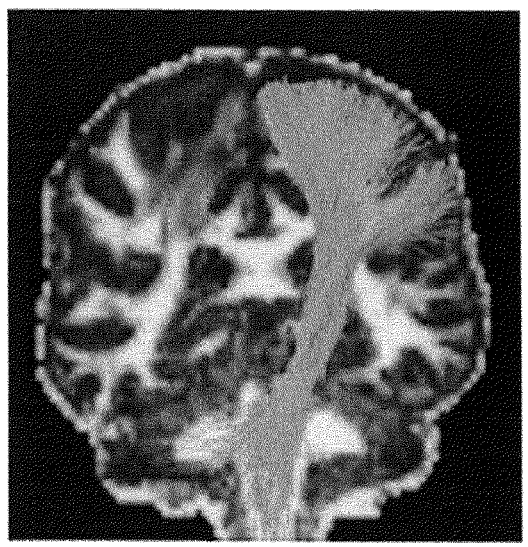 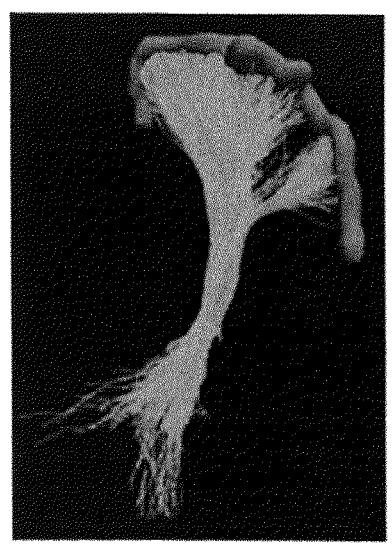
FIG 7A   FIG 7B

 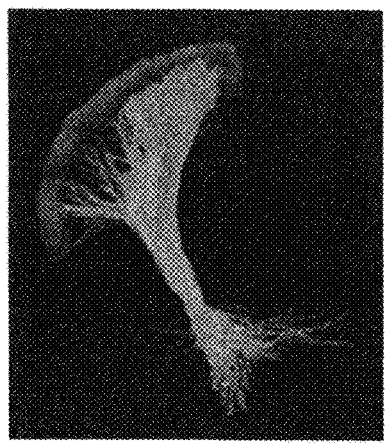
FIG 9A  FIG 9B
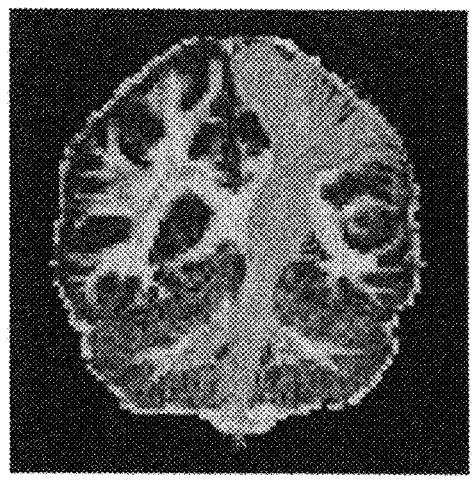 
FIG 10A  FIG 10B

EDEMA INVARIANT TRACTOGRAPHY

CROSS-REFERENCE TO RELATED APPLICATIONS

This is a 371 national stage of PCT/US2015/048844, filed Sep. 8, 2015, which claims the benefit under 35 USC 119(e) of U.S. Provisional Patent Application No. 62/047,980, filed Sep. 9, 2014.

BACKGROUND

There are approximately 250,000 new cases of brain tumors diagnosed per year in the US. These lesions represent some of the most difficult diagnoses with regards to management and frequently, if not always, require a combination of surgical and chemotherapeutic and/or radiation treatment. The central nervous system is densely organized into multiple eloquent cortical areas responsible for language, vision, motor, and other important functions. White matter (WM) pathways such as the arcuate fasciculus (AF), optic radiations (OR), and cortico-spinal tract (CST) form the complex and communication structure between these cortical areas leading to key eloquent brain disrupt function.

During brain surgery, a neurosurgeon may need to cut or push brain fiber tracts, the neuronal cables that connect the critical brain areas, in order to reach a mass or tumor. The goal of modern treatment planning is to determine the optimal resection margin that maximizes tumor removal while preserving language, visual and motor function. With mounting evidence that the extent of resection (EoR) of a brain tumor is linked to survival, maximizing the EoR while preserving function is of critical importance.

Surgical planning relies heavily on MRI to visualize anatomic structures with high fidelity. Since its introduction, diffusion magnetic resonance imaging (dMRI) (both diffusion tensor imaging (DTI) and high angular resolution diffusion imaging (HARDI) has provided critical insight into the WM fiber pathways of the brain. Specifically, DTI ushered in a new era in surgical planning by enabling the visualization of fiber tracts and characterization of WM changes. The direction and magnitude of water diffusion is encoded and modeled by dMRI and subsequently used by fiber tracking algorithms reconstruct WM pathways of interest. Clinical neuro-navigation systems today provide fiber reconstruction (typically DTI-based) to visualize the anatomic relationship between a specific WM pathway, e.g., CST and the lesion of interest, e.g., tumor, and are becoming the standard of care for treating lesions in vicinity of eloquent brain. Further, Current software tools are validated only on the main trunk of the CST. Identifying eloquent tracts in the vicinity of a tumor requires the ability to perform fiber tracking through regions affected by edema and mass effect. Edema, which manifests as a change in the free water (FW) content of tissue, is a significant confounder for surgical planning as it lowers anisotropy and obfuscates the presence of the underlying fiber bundle, which may remain completely unaffected.

There is now a growing use of fiber tractography for surgical planning. In today's clinical environments, tractography is one of the most complicated and time-consuming processes. This process, of course, needs to be repeated for every tract. Current solutions require the placement of multiple inclusion and exclusion (filtering) ROIs to extract the tract of interest. Finally, the end result is "tweaked" by the user through adjustments of FA threshold and angular curvature. This process, of course, needs to be repeated for every tract. Not only are the current tools to perform these tasks complex, but they are also unable to process higher order diffusion data, do not correct for mass effect or edema, or provide an interface to view/extract quantitative tract data, e.g., average FA, fiber count, etc. Furthermore, current tractography suites lack sufficient transparency for clinical research. When the methods and parameters used to obtain results are unknown, comparison of results between packages is meaningless and validation of one software suite, e.g., STIM, does not translate to another software package.

Unfortunately, the widespread use of tractography in neuro-oncology is hindered by several factors. From a clinical and practical standpoint, tractography requires expensive, proprietary software and a comprehensive knowledge of neuro-anatomy to place ROIs to initiate tracking, which introduces intra- and inter-user variability. This variability is further compounded by mass effect and the dependence of current algorithms on measures that prevent tracking through edema. Importantly, tractography software does not provide measures for immediate tract assessment.

Current tools frequently fail to reconstruct fiber pathways that are edematous, displaced or infiltrated by a surrounding tumor and in normal tissue with crossing fibers. Thus they treat edematous regions heuristically and cannot track through complex regions with crossing fibers, thus leading to artifactual and inadequate tracking results, thereby limiting clinical utility. Furthermore, these tools require manual placement of seed regions to initiate tracking, which is not only time consuming, but also subject to intra- and inter-user variability, differences in parameter selection as well as variability in software implementations. Finally, despite multi-modal imaging acquisitions, there is still a relative lack of robust structural and functional measures that quantitatively evaluate the change in WM tract characteristics in the presence of tumor and following resection.

Of the challenges identified above, a critical one that confounds all current clinical tools is the presence of edema in peritumoral regions where tracts may be intact but appear disrupted due to the presence of edema. This causes a change in DTI parameters, such as FA, leading to an artificial loss of fibers. Also, DTI-based tracking is inaccurate in WM regions with crossing fibers. Also, existing tractography algorithms use a plethora of mathematical algorithms, parameters and heuristics leading to variation in results, with no established standards for evaluating the differences.

Thus, there remains a need in the art for a validated treatment planning package that includes the following modules: 1) tractography that is robust to edema and mass effect, 2) automated extraction of complete and partial tracts confounded by edema and displaced by mass effect, and 3) robust quantification of WM tract health in the presence of tumor.

SUMMARY OF THE INVENTION

In one aspect, an edema invariant tractography method is provided and includes (i) acquiring data from a patient using a 3-shell, high angular resolution diffusion imaging sequence, wherein the first shell as a b-value of about 300 $s/mm^2$ and a gradient direction of about 15, the second shell has a b-value of about 800 $s/mm^2$ and a gradient direction of about 30, and the third shell has a b-value of about 2000 $s/mm^2$ and a gradient direction of about 64; (ii) modeling the data using a multi-compartment model; and (iii) reconstructing the fibers through a probabilistic tracking algorithm using a fiber orientation distribution which has streamlines fitted to the output of the probabilistic tracking algorithm. In one embodiment, the multi-compartment model is $s_k=f\ s_o^w \exp(-b_k d_o^w)+(1-f)\ FOD*FIR(b_k,u_k)$, wherein $s_k$, $u_k$, $b_k$, f, $s_o^w$, $d_o^w$, FOD, FIR, and * are defined herein.

In another aspect, an edema invariant tractography method is provided and includes (i) acquiring data from a patient using a multishell, high angular resolution diffusion imaging sequence; (ii) modeling the data using a multi-compartment model comprising a free water compartment; and (iii) reconstructing the fibers through a probabilistic tracking algorithm using a fiber orientation distribution which has streamlines fitted to the output of the probabilistic tracking algorithm. In one embodiment, the multi-compartment model contains a fiber orientation distribution. In another embodiment, the multi-compartment model is $s_k=f\ s_o^w \exp(-b_k d_o^w)+(1-f)\ FOD*FIR(b_k,u_k)$, wherein $s_k$, $u_k$, $b_k$, f, $s_o^w$, $d_o^w$, FOD, FIR, and * are defined herein.

In a further aspect, a method of identifying tracts in an edematous brain of a patient is provided and includes (i) acquiring data from the patient using a 3-shell, high angular resolution diffusion imaging sequence, wherein the first shell as a b-value of about 300 s/mm² and a gradient direction of about 15, the second shell has a b-value of about 800 s/mm² and a gradient direction of about 30, and the third shell has a b-value of about 2000 s/mm² and a gradient direction of about 64; (ii) modeling the data using a multi-compartment model; and (iii) reconstructing the fibers through a probabilistic tracking algorithm using a fiber orientation distribution which has streamlines fitted to the output of the probabilistic tracking algorithm. In one embodiment, the multi-compartment model is $s_k=f\ s_o^w \exp(-b_k d_o^w)+(1-f)\ FOD*FIR(b_k,u_k)$, wherein $s_k$, $u_k$, $b_k$, f, $s_o^w$, $d_o^w$, FOD, FIR, and * are defined herein.

In yet another aspect, a method of identifying tracts in an edematous brain of a patient is provided and includes (i) acquiring data from a patient using a multishell, high angular resolution diffusion imaging sequence; (ii) modeling the data using a multi-compartment model comprising a free water compartment; and (iii) reconstructing the fibers through a probabilistic tracking algorithm using a fiber orientation distribution which has streamlines fitted to the output of the probabilistic tracking algorithm. In one embodiment, the multicompartment model contains a fiber orientation distribution. In another embodiment, the multi-compartment model is $s_k=f\ s_o^w \exp(-b_k d_o^w)+(1-f)\ FOD*FIR(b_k,u_k)$, wherein $s_k$, $u_k$, $b_k$, f, $s_o^w$, $d_o^w$, FOD, FIR, and * are defined herein.

In still a further aspect, a tractography electronic device is provided and includes (a) code for performing a 3-shell, high angular resolution diffusion imaging sequence, wherein the first shell as a b-value of about 300 s/mm² and a gradient direction of about 15, the second shell has a b-value of about 800 s/mm² and a gradient direction of about 30, and the third shell has a b-value of about 2000 s/mm² and a gradient direction of about 64; (b) code for performing a multi-compartment model; (c) code for reconstructing the fibers through a probabilistic tracking algorithm using a fiber orientation distribution which has streamlines fitted to the output of the probabilistic tracking algorithm; and (d) at least one processing unit for executing the code of (a)-(c).

In another aspect, a tractography electronic device is provided and includes (a) code for performing a multishell, high angular resolution diffusion imaging sequence; (b) code for performing a multi-compartment model comprising a free water compartment; and (c) code for reconstructing the fibers through a probabilistic tracking algorithm using a fiber orientation distribution which has streamlines fitted to the output of the probabilistic tracking algorithm; and (d) at least one processing unit for executing the code of (a)-(c).

In still another aspect, a tractography electronic device is provided and includes at least one processing unit configured to (i) acquire data using a 3-shell, high angular resolution diffusion imaging sequence, wherein the first shell as a b-value of about 300 s/mm² and a gradient direction of about 15, the second shell has a b-value of about 800 s/mm² and a gradient direction of about 30, and the third shell has a b-value of about 2000 s/mm² and a gradient direction of about 64; (ii) model the data using a multi-compartment model; and (iii) reconstruct the fibers through a probabilistic tracking algorithm using a fiber orientation distribution which has streamlines fitted to the output of the probabilistic tracking algorithm In a further aspect, a tractography electronic device is provided and includes at least one processing unit configured to (i) acquire data using a multishell, high angular resolution diffusion imaging sequence; (ii) model the data using a multi-compartment model comprising a free water compartment; and (iii) reconstruct the fibers through a probabilistic tracking algorithm using a fiber orientation distribution which has streamlines fitted to the output of the probabilistic tracking algorithm.

In another aspect, a computer program product, stored on a computer readable medium, is provided and includes instructions for configuring a computer to (i) acquire data using a 3-shell, high angular resolution diffusion imaging sequence, wherein the first shell as a b-value of about 300 s/mm² and a gradient direction of about 15, the second shell has a b-value of about 800 s/mm² and a gradient direction of about 30, and the third shell has a b-value of about 2000 s/mm² and a gradient direction of about 64; (ii) model the data using a multi-compartment model; and (iii) reconstruct the fibers through a probabilistic tracking algorithm using a fiber orientation distribution which has streamlines fitted to the output of the probabilistic tracking algorithm.

In yet a further aspect, a computer program product, stored on a computer readable medium, is provided and includes instructions for configuring a computer to (i) acquire data using a multishell, high angular resolution diffusion imaging sequence (ii) model the data using a multi-compartment model comprising a free water compartment; and (iii) reconstruct the fibers through a probabilistic tracking algorithm using a fiber orientation distribution which has streamlines fitted to the output of the probabilistic tracking algorithm.

Other aspects and advantages of the invention will be readily apparent from the following detailed description of the invention.

BRIEF DESCRIPTION OF THE DRAWINGS

FIGS. 2A-2E are brain scans of 9 tumor patients and illustrate tracking of the CST. FIG. 2A is generated using a DTI model. FIG. 2B is generated using a free water corrected DTI model, showing a mild increase. FIG. 2C is generated using a high angular resolution diffusion imaging model with deterministic tracking. FIG. 2D is generated using a high angular resolution diffusion imaging model and probabilistic tracking. FIG. 2E is generated using MCM with free water correction and probabilistic tracking of the present invention.

FIG. 3A is generated using clinical planning software available in the art overlaid with functional activation. FIGS. 3B and 3C are generated using the methods described herein. The light regions are tracts available to the surgeons (FIG. 3C, left central, below mid-line), the dark grey regions are tracts created by the method described herein, the overlaid with STIM points.

FIGS. 4A-4B are flow charts illustrating the computational steps entailed with the methods and software described herein. FIG. 4A is a simplistic diagram illustrating the methods described herein. Boxes 2 and 6 are steps utilized in the art. Boxes 1, 3, 4 and 5 encompass the methods described herein. Visualization box 5 incorporates boxes 1, 3, and 4. FIG. 4B is a detailed flow chard with includes the steps described in FIG. 4A together with optional processing steps. Abbreviations in FIG. 4B include DICOM is Digital Imaging and Communications in Medicine; NIFTI is Nanoscale Integrated Fabrication Testing and Imaging; SUSAN is Smallest Univalue Segment Assimilating Nucleus; BET is the Brain Extraction tool; FLIRT is the Flexible Image Registration Toolbox; T1CE is Axial 3D contrast enhanced T1-weighted images; N3 refers to the nonparametric nonuniform intensity normalization technique; jLMME is Joint Linear Minimum Mean Squared Error; B0 is the image taken at b=0; T1 and T2 are the times that it takes for proton relaxation to occur; DRAMMS is Deformable Registration via Attribute Matching and Mutual-saliency weighting; DWI is diffusion weighted imaging; and HARDI is High Angular Resolution Diffusion Imaging.

FIGS. 6A-6C are images of the motor cortex in Eve template (FIG. 6A), registered to patient 1 (FIG. 6B) and registered to patient 2 (FIG. 6C).

FIGS. 7A-7B are images of reconstructed CST of subject 1 on the healthy side. FIG. 7A is an overlay on a representative slice of FA image. FIG. 7B is the tract with the motor strip (red) showing that the reconstructed fibers overlap with the motor strip.

FIG. 8A is the challenge motor strip overlaid on the CST. FIG. 8B is the CST displaced by the tumor and tracking through the edema. FIG. 8C is the CST displaced to both sides of the motor strip by the edema.

FIGS. 9A-9B are images of the CST of subject 2 on the healthy side (right) and overlaid with the pre-central gyms (motor strip) provided by the Challenge. The high overlap with the strip provides visual evaluation of the accuracy of the tracking paradigm. FIG. 9A illustrates CST+brain matter while FIG. 9B illustrates CST+tumor.

FIGS. 10A-10B are images of the CST of subject 2 on the affected side showing the PLIC being displaced by mass effect. The overlap with the Challenge motor strip demonstrates accurate reconstruction of the hand, face and foot area, despite the mass effect. FIG. 10A illustrates CST+brain matter while FIG. 10B illustrates CST+tumor.

DETAILED DESCRIPTION OF THE INVENTION

Figure 1:
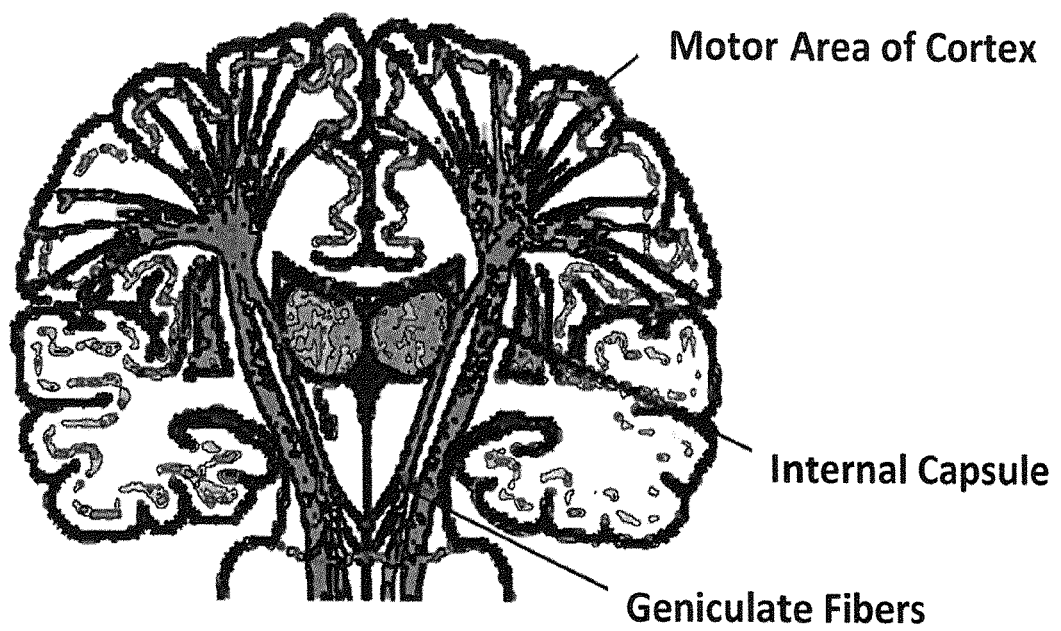
FIG. 1 is a pictorial illustration of the course of the CST from Gray, "Anatomy of the human body", 1858.

The inventors have provided edema invariant tracking methods that addresses the limitations discussed above for current fiber tracking methods. Specifically, the tracking paradigm described herein is expected to provide a significant advancement over current clinical tools, improving and optimizing the way treatment planning is performed, ultimately leading to improved care for patients. The methods and systems described herein encompass the described components and advantages into a single tool that provides an automated processing and tracking paradigm for diffusion based surgical planning that is resilient to edema. These methods and systems are applicable to a wide variety of clinical pathologies, including conditions where brain edema is present.

Accordingly, the inventors developed a system which is based on several novel aspects. The system incorporates a fast higher order multishell, multiband image acquisition. The system also incorporates a multicompartment model based on high angular resolution diffusion imaging to track fibers known to those skilled in the art. In one embodiment, the system incorporates data acquisition at low b-values that are sensitive to free water diffusion, thereby allowing for correction for edema through the use of the multi-compartment model. In another embodiment, the system incorporates visualization of tracts and diffusion measures associated with the tracts to help assess change and damage.

Advantageously, the apparatus and methods described herein are capable of determining if the anisotropy in edematous regions is due to a breakdown in tract integrity or the presence of increased extra-cellular water. In one embodiment, the methods described herein, accurately establish the presence of tracts in these regions. In a further embodiment, the methods described herein are capable of tracking through white matter. In yet another embodiment, the methods described herein are capable of tracking through crossing fiber regions in the absence or presence of increased free water. In still a further embodiment, the methods described herein are invariant to increased local free water distribution.

The methods described herein may be utilized in conjunction with other interventions to improve the treatment of the edema before, concurrently with, or after application of the methods described herein. Such additional interventions may include, without limitation, medications, radiation, emergency surgery, surgery procedures at later times in the patient's life, and/or adjunctive therapies such as physical therapy, speech therapy, recreation therapy, occupational therapy, vision therapy, or combinations thereof. Such interventions may be selected and applied by the physician. Medications useful in conjunction with the methods described herein include, without limitation, chemotherapeutics, anti-inflammatories, prednisone, methylprednisolone sodium succinate, methylprednisolone acetate, betamethasone, betamethasone acetate, dexamethasone, dexamethasone sodium phosphate, triamcinolone acetonide, mannitol, hydrocortisone, hydrocortisone sodium succinate, and dihydrocortisone sodium succinate, among others.

In one embodiment, the edema is present in the brain. In a further embodiment, the edema requires treatment by surgery. In another embodiment, the edema requires radiation treatment.

The methods and systems described herein are useful in the preparing for and/or performing surgeries or radiation on the brain by obtaining quantitative tract statistics. Alternatively, or in addition, the methods and systems described herein permit intra-operative distinguishing between true positive and false positive fiber tracts which is useful to guide/assist the physician during surgery. In another embodiment, the methods and systems are useful in the preparing for and/or the removal of one or more tumor in the brain. The peritumoral regions may be analyzed, tracts based on the distance from the tumor can be determined and/or histograms of diffusion measures may be obtained.

By doing so, the methods described herein improve the resection of a tumor from the brain of the patient. As a result, the methods described herein are anticipated to result in the patient maintain as much of the physical, cognitive, social, emotional, and/or behavioral skills as possible after removal of the tumor.

A. DEFINITIONS

As used herein, "disease", "disorder" and "condition" are used interchangeably, to indicate an abnormal state in a subject having edema in one or more parts of the brain.

The term "edema" as used herein refers to swelling resulting from any condition. In one embodiment, the edema is the brain. The edema may result from a tumor, cyst, genetic defect, chemical imbalance such as low blood sodium, multiple sclerosis, an injury, blood clot, infection, hemorrhage, high altitudes, opioid abuse, malignant hypertension, toxin exposure, diabetic ketoacidosis, among others, or combinations thereof. The infection may result from any conditions including, without limitation, meningitis, encephalitis, toxoplasmosis, subdural empyem, among others, or combinations thereof. The injury to the patient includes any injury resulting from when an external force injures the brain and may occur on a specific location of the brain or over a widespread area. The injury can also include damage to the scalp and skull.

The term "b-value" is known to those skilled in the art to be a factor of diffusion weighted sequences. The b factor summarizes the influence of the gradients on the diffusion weighted images. The higher the value b, the stronger the diffusion weighting.

The term "tract" or "fiber" as used herein are interchangeable and refer to a discrete nerve or bundles of axons present in the brain. The fibers originate largely from the pre-central gyms (motor cortex), expanded into the pre-motor cortex and post-central gyms to increase the sensitivity of the tract; as the tract descends in the corona radiata, the axons of the tract converge and form the posterior limb of the internal capsule (PLIC) and then plunge into the anterior part of the cerebral peduncles as shown on FIG. 1. The fibers include those that track through the white matter. The fibers may be physically separated from other fibers or may cross, i.e., crossing fibers. The fibers may be any degree of curvature and include fibers of high curvature. The high curvature fibers including, without limitation, the lateral projections of the cortico-spinal tract, arcuate fasciculus, and Meyer's loop of optic radiation. The "fibers" identified herein may also include the cortico-spinal tract (CST), association fibers such as short and long association fibers, projection fibers, commissural fibers, among others, or combinations thereof. In one embodiment, the fibers include uncinate fibers, fasciculus fibers, cingulum fibers, superior longitudinal fasciculus fibers, inferior longitudinal fasciculus fibers, perpendicular fasciculus fibers, occipitofrontal fasciculus fibers, fornix fibers, arcuate fasciculus fibers, optic radiations such as the Meyer's loop of the optic radiation, among others.

"TITAN™" as used herein is acronym for a tumor imaging and tractography analyzer which utilizes the methods described herein.

It is to be noted that the term "a" or "an" refers to one or more. As such, the terms "a" (or "an"), "one or more," and "at least one" are used interchangeably herein.

The words "comprise", "comprises", and "comprising" are to be interpreted inclusively rather than exclusively. The words "consist", "consisting", and its variants, are to be interpreted exclusively, rather than inclusively. While various embodiments in the specification are presented using "comprising" language, under other circumstances, a related embodiment is also intended to be interpreted and described using "consisting of" or "consisting essentially of" language.

As used herein, the term "about" means a variability of 10% from the reference given, unless otherwise specified.

A "patient" is a mammal, e.g., a human, mouse, rat, guinea pig, dog, cat, horse, cow, pig, or non-human primate, such as a monkey, chimpanzee, baboon or gorilla. In one embodiment, the patient is a human.

Unless defined otherwise in this specification, technical and scientific terms used herein have the same meaning as commonly understood by one of ordinary skill in the art and by reference to published texts, which provide one skilled in the art with a general guide to many of the terms used in the present application.

B. PRE-PROCESSING

Pre-processing steps may be performed by those skilled in the art prior to the steps of the methods described herein. The pre-processing may be semiautomated, e.g., using BrainLab software or techniques, or may be completely user driven. The pre-processing may be performed to ensure that the signal from each voxel contains the right temporal and spatial information. In one embodiment, the pre-processing steps include, without limitation, skull stripping, inhomogeneity correction, registration, slice timing correction, motion correction (realignment), spatial normalization, T1 image preprocessing, volume based normalization, surface based normalization, interpolation methods, or smoothing among others. In one embodiment, the pre-processing includes registration to the T1-CE space.

The pre-processing steps may be performed by one skilled in the art such as the physician or technician or may be performed automatically.

C. IMAGE FITTING

The present application is designed to process a multi-shell diffusion sequence acquisition of the patient. The acquisition is performed using tools available to those skilled in the art of MRI data acquisition. In one embodiment, the imaging is acquired using a multi-shell diffusion imaging.

The acquisition may also be performed using a novel multishell, multiband (MSMB) acquisition. This MSMB was designed with gradient directions defined optimally, which is distinguished from existing multishell acquisitions. It is also done in clinically feasible time.

The MSMB acquisition combines a dense angular sampling of gradient directions with a probe of the diffusion signal at different b-values and gradient directions. In doing so, the acquisition using different b-values and gradient directions permits adequate delineation of multiple compartments.

The acquisition is performed using b-values which are sensitive to free water diffusion and b-values which provide enhanced angular resolution. The b-values correspond to the shells of the method. In one embodiment, the acquisition is performed over a range of b-values. In a further embodiment, the acquisition is performed using b-values that are sensitive to free water diffusion. In another embodiment, the acquisition is performed using low b-values of about 10 to about 400 s/mm² or integers or ranges there between, median b-values of about 400 to 1000 s/mm² or integers or ranges there between, and high b-values of about 1500 to about 5000 s/mm² or integers or ranges there between. In a further embodiment, the b-values are about 300, about 800, and about 2000 s/mm².

The acquisition is also performed with defined gradient directions which correspond to the b-values noted above, respectively. In one embodiment, the acquisition is performed over a range of gradient directions. In another embodiment, the acquisition is performed using gradient directions ranging from about 7 to about 100 or integers or ranges there between. In a further embodiment, the gradient directions are about 10 to about 80 or integers or ranges there between; about 25 to about 128 or integers or ranges there between; and. In another embodiment, the gradient directions are about 15, 30, and 64.

The MSMB useful herein includes at least 3 shells. In one embodiment, the MSMB includes about 3 to about 6 shells, or integers or ranges there between. In a further embodiment, the MSMB is 3-shell high angular resolution diffusion imaging sequence. In another embodiment, the MSMB is a 3-shell high angular resolution diffusion imagine sequence where one shell as a b-value of about 300 s/mm² and a gradient direction of about 15, the second shell has a b-value of about 800 s/mm² and a gradient direction of about 30, and the third shell has a b-value of about 2000 s/mm² and a gradient direction of about 64.

One of skill in the art would readily be able to perform high angular resolution diffusion imaging. In one embodiment, high angular resolution diffusion imaging may be performed as described in Tuch, Magnetic Resonance in Medicine, 52: 1358-1372, 2004, which is incorporated by reference herein.

The MSMB also includes non-diffusion weight acquisitions. In one embodiment, at least about 7 non-diffusion weighted acquisitions are performed. In a further embodiment, about 7 to about 20 non-diffusion weighed acquisitions are performed. In another embodiment, about 7 non-diffusion weighted acquisitions are performed.

In doing so, data acquisition can be accomplished in less time than is required for methods currently used in the art. In one embodiment, data acquisition is less than about 15 minutes. In another embodiment, data acquisition takes about 13 minutes. In a further embodiment, data acquisition takes about 5 to about 15 minutes. In still another embodiment, data acquisition takes at least about 6 minutes.

In one embodiment, the MSMB sequence is a 3-shell acquisition with shells corresponding to a b-value of 300 s/mm² and 15 gradient directions; b-value of 800 s/mm² and 30 gradient directions; b-value of 2000 s/mm² and 64 gradient directions, respectively); and 7 non-diffusion weighted acquisitions.

D. MULTI-COMPARTMENT MODEL (MCM)

A second step in the methods described herein includes modeling the data obtained from the imaging. The second component of the methods described herein is an MCM. The MCM used herein is a multi-compartment model, unlike the single-compartment models used in the art. The MCM can be fitted to a single shell acquisition. However, the inventors found that the method does not optimally estimate the free water like a multi-shell sequence. The MCM may therefore be fitted to a multi-shell data acquisition such as that described above. In one embodiment, the MCM is edema invariant.

MCMs in the art are the Neurite Orientation Dispersion and Density Imaging Matlab Toolbox (NODDI-NITRC), the composite hindered and restricted model of diffusion (CHARMED), and the DTI-based free water model described in Pasternak (Magnetic resonance in medicine, 62:717-30, 2009). In another embodiment, the inventors utilized a novel high angular resolution diffusion imaging model MCM.

The novel MCM described herein contains 2 compartments. The first compartment models the free water diffusion which corrects for edema. The second compartment models the anisotropic diffusion within and around axons. In one embodiment, the second compartment is a fiber orientation distribution (FOD) for fitting the MCM to the whole brain, or a combination thereof. In another embodiment, high angular resolution diffusion imaging models other than FOD can be used and include high order tensors (HOT) or orientation distribution functions (ODF), among others.

The novel MCM described herein, therefore, accomplishes a variety of tasks in one fell swoop. In one embodiment, the MCM estimates diffusion directions and the amount of extra-cellular water in the presence of edema. In a further embodiment, the MCM fits a high order component. In another embodiment, the MCM follows the following algorithm:

$$s_k = f s_o^w \exp(-b_k d_o^w) + (1-f) \text{FOD} * \text{FIR}(b_k, u_k)$$

In this algorithm, $s_k$ is the measured signal intensity corresponding to k-th diffusion gradient; $u_k$ is the direction corresponding to k-th diffusion gradient; $b_k$ is the b-value corresponding to k-th diffusion gradient; f is the volume fraction and baseline signal intensity of the free water compartment; $s_o^w$ is the volume fraction and baseline signal intensity of the free water compartment; $d_o^w$ is the free water diffusion coefficient; FOD is the fiber orientation distribution; FIR is the fiber impulse response; and * is the convolution operator.

The Fiber Impulse Response (FIR) is estimated by fitting a DTI-model to the data and identifying voxels with FA>0.7 as single fiber voxels. The spherical harmonic (SH) representation of the FOD was utilized. The SH order was chosen based on the number of gradient directions that have been acquired in each of the shells and whether the directions in the different shells are independent of each other.

The $s_o^w$ variable is estimated using a CSF map from a tumor growth model or segmentation map.

The FOD and the volume fraction f are estimated using the following equation. In this equation, $0 \leq f \leq 1$; $B_c \leq 0$; $s_w$ is the signal from free water compartment; H is a spherical harmonics observation matrix; R is a convolution operator computed from FIR; c is a spherical harmonic representation of FOD; and B is a spherical harmonics evaluated on points on which positive constraint is imposed.

$$\hat{f}, \hat{c} = \arg \min |s - (f s_w + (1-f) H R c)|^2$$

The MCM described herein is quick and accurate, requiring only a short time for the model fitting. In one embodiment, the MCM is performed in about 2 to about 120 minutes.

E. TRACKING ALGORITHM

The third component of the method described herein is a probabilistic tracking algorithm. The data fitted with the MCM provided above is utilized to provide a FOD-based probabilistic streamline tracking algorithm. Specifically, once the data is fitted with the MCM, the FW compartment is used to characterize the edema and an FOD is fitted to the FW corrected data. The FOD identifies the crossings at each point in the brain that is the different directions of water propagation at each point in the brain. Tracking is initiated at a region of interest manually or automatically defined. A probabilistic tracking algorithm follows each of these diffusion directions starting from all the points in this region, till it reaches the stopping criterion (which could be a tissue mask or a threshold value on a diffusion parameter). Streamlines are obtained by joining the points on these paths of propagation. This produces a representation of the fibers/tracts in the brain.

In one embodiment, the tracking is started on the WM-GM (white matter-gray matter) boundary, with additional seeding around the tumor. For the stopping criteria, a mask is defined delimiting the valid tracking domain. In a healthy brain, the mask is loosely defined for the tracking to stop at high curvature turns (typically)>60°) and/or on encountering a parameter threshold, i.e., FA in tensor-based tracking algorithms. The tracking follows a simple and crude "yes/no" decision based on the binary mask. This is an aggressive and inadequate stopping criterion, especially while tracking through a complex WM tissue, e.g., crossing fibers with edema, which affects these parameters and results in the premature termination of tractography. The valid tracking domain is the WM masked by the tumor. Tracking is further constrained to voxels with an FOD amplitude higher than 0.1. This limits spurious tracts while optimizing the reconstruction of compromised tracts (displaced, edematous).

The FOD-based probabilistic tractography is initiated on every voxel defined in the starting criterion. The tracking is propagated probabilistically, based on the probability of an underlying fiber direction (identified by the peaks of the FOD). These various directions of propagation are fitted with a streamline. These streamlines are representative of the fibers/tracts in the brain and together form fiber bundles seen in the figures provided below.

In one aspect, the probabilistic tracking algorithm reconstructs the fibers through a probabilistic tracking algorithm using a fiber orientation distribution which has streamlines fitted to the output of the probabilistic tracking algorithm.

F. VALIDATION AND EVALUATION

The tracking results may be evaluated using several criteria known to those skilled in the art. In one embodiment, the tracking results are evaluated using replication. In another embodiment, the tracking results are evaluated using anatomical correctness such as cortical stimulation. In a further embodiment, tracking results are evaluated using classical anatomy which would be understood by one skilled in the art. In another embodiment, the tracking results are evaluated using comparisons with current clinical tools such as those described above distributed by BrainLab.

In one embodiment, the tracking results are evaluated using cortical stimulation (STIM) data. STIM is an accepted gold standard for testing language and motor function and is known to those skilled in the art. See, e.g., Mandelli, 2014; Kim, Neurosurgery, 64: 836-45; discussion 345-6, 2009, and Sanai, Neurosurgical focus, 28: E1, 2010, which are incorporated by reference herein. In one embodiment, the STIM sites may be displayed with a margin to incorporate possible inaccuracies due to correction for brain shift.

The methods and systems described herein are capable of importing and generating STIM data. This STIM data may then be utilized to visualize overlap between STIM sites and the tracts identified as described herein.

In another embodiment, the tracking results are evaluated by comparison with clinical planning tools. The clinical planning tools available to those skilled in the art include, without limitation, using DynaSuite or iPlan software. The DTI-based tracking results for CST (motor pathway) produced by these tools on patient data may be compared with those data acquired using the methods of the claimed invention. In one embodiment, the methods described herein perform concurrent viewing of multiple tractography results. In another embodiment, the overlap is quantified between the two tracking results. By doing so, the extent of overlap and/or highlighting of additional/new fibers can be determined.

G. SYSTEMS AND DEVICES

The methods described herein are performed by an electronic device. The term "electronic device", as used herein, refers to a computer processor (processing unit) or computer-programmed instrument that generates numerical or graphical data, i.e., code. Therefore, the methods described herein include computer program products which are stored on a computer readable medium. In one embodiment, the computer program product includes instructions for configuring a computer to perform the methods described herein.

The computers and devices discussed herein may be based on the computers and components available in the art. Such components may include, without limitation, a central processing unit including graphics processing units, a chipset including a north bride, a random-access memory, a read-only memory, basic input output system, unified extensible firmware interface, buses, CMOS battery, expansion cards, storage devices, fixed media such as hard disk drives, solid-state drives, disk array controllers, removable media such as USB flash drives or optical discs, input devices such as a mouse, keyboard, touchpads, webcams, microphones, joysticks, or image scanners, or output devices such as printers, speakers, or Braille embossers, or combinations thereof.

The programs utilized to perform the methods described herein may be prepared by those skilled in the art. The programs include executable form or code that the computer can use directly to execute the instructions, i.e., the software. The code used to perform the methods may be converted into an executable file, may be executed with the aid of an interpreter, or may be embedded thereby not requiring human intervention. Two or more computer programs may be utilized to perform the methods and may run independently or simultaneously.

Figure 4B:
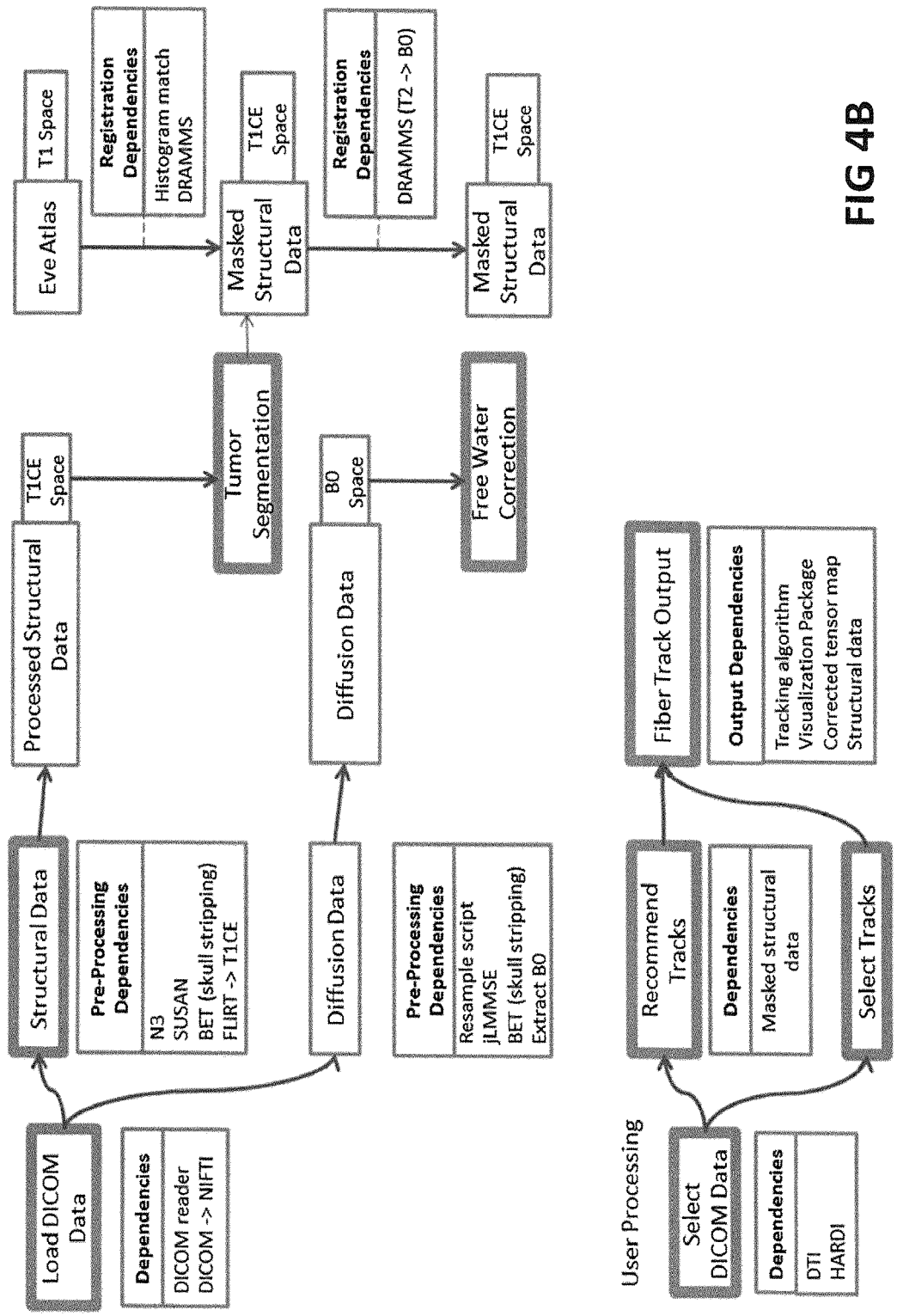

In one embodiment, the code or software utilized to perform the methods described herein is outlined in FIG. 4A and provides the functions and uses the methods and devices discussed herein. In a further embodiment, the code or software utilized to perform the methods described herein is outlined in FIG. 4B and provides the functions and uses the methods and devices discussed herein. In another embodiment, the code performs a multishell, high angular resolution diffusion imaging sequence. In still a further embodiment, the code performs a 3-shell, high angular resolution diffusion imaging sequence, wherein the first shell as a b-value of about 300 s/mm$^2$ and a gradient direction of about 15, the second shell has a b-value of about 800 s/mm$^2$ and a gradient direction of about 30, and the third shell has a b-value of about 2000 s/mm$^2$ and a gradient direction of about 64. In a further embodiment, the code performs a multi-compartment model. In still a further embodiment, the code performs a multi-compartment model which includes a free water compartment. In yet another embodiment, the code reconstructs the fibers through a probabilistic tracking algorithm using a fiber orientation distribution which has streamlines fitted to the output of the probabilistic tracking algorithm.

The code described herein may be executed as described above and using techniques in the art. In one embodiment, the devices described herein include at least one processing unit for executing the code.

H. WEB-BASED TOOL—TITAN™

The web-based software tool, i.e., as described herein contains model-fitting, tracking and visualization of tracts identified herein and its properties as separate components. Advantageously, TITAN™ is a powerful and capable tractography-based planning tool, which is simple and efficient enough for daily clinical use. Therefore, in one embodiment, TITAN™ may be utilized as a web-based or web-accessible application. In one embodiment, TITAN™ may be accessed from handheld devices or consoles, facilitating remote interaction between disciplines. This thereby, advantageously, permits use of this technology by those skilled in the art at one site or multiple sites either at the same location or those which are physically different.

TITAN™ thereby permits users to perform a variety of functions. In one embodiment, users are capable of querying patient databases from one or more databases. Such databases may be available to the public or may be private databases. Users may then automatically transfer the imaging data to the local server. Once a user identifies a patient to be analyzed, the structural data undergoes preprocessing as described above. Simultaneously, the diffusion data is processed as described herein. Briefly, the MCM is fitted as described herein and the tractography is performed to extract all WM fibers. TITAN™ then is capable of recommending tracts for visualization and analysis. Finally TITAN™ is capable of performing 3D visualization viewable by those skilled in the art. Visualization may be based on a number of software packages utilized to view fibers. In one embodiment, TITAN™ leverages the open source X-ray Tool (XTK) developed by Sandia National Laboratories (www.xraytoolkit.com/Sandia/Disclaimer.)aspx.

Desirably, the methods described herein are performed in the absence of designating one or more regions of interest (ROI) placement. However, the user will be permitted to reconstruct tracts based on ROI placement, if desirable. ROI may be placed prior to or subsequent to the methods described herein. ROI may also be placed as described below to validate the novel methods. Designating one or more ROI may be performed by those skilled in the art using methods and software such as the statistical planning mapping (SPM-Neuroimaging Informatics Tools and Resources Clearinghouse), Analysis of Functional NeuroImages (AFNI-National Institutes of Health), and BrainVoyager (Brain Innovation) software packages and tools such as the MARSeille Boîte À Région d'Intérêt (MarsBar tool-Neuroimaging Informatics Tools and Resources Clearinghouse) for SPM and the FSL ROI Toolbox (spm-toolbox.sourceforge.net).

If tumors are present in the scans, tumor and edema segmentation may be performed semi-automatically using programs and skill in the art. The tumor segmentation map is used to inform the user of what white matter tracts are in the immediate peritumoral vicinity. These tracts may be recommended to the user for visualization and analysis. Finally, the recommended and user created tracts are visualized in 3D.

The user can overlay any structural imaging data to facilitate surgical and radiation treatment planning A sidebar presents quantitative tract statistics, such as distance from tumor, histogram of diffusion measures etc. All tract data (reconstructed tract with associated measures) are optionally user exportable. To facilitate comparison, both quantitative and qualitative, between the tractography results described herein and commercial packages, the user may be provided with functionality that enables the concurrent viewing of multiple tractography results. Activation of this functionality optionally triggers a quantitative sidebar that defines the extent of overlap and highlights additional/new fibers identified by described herein tractography method described herein.

Figure 5A:
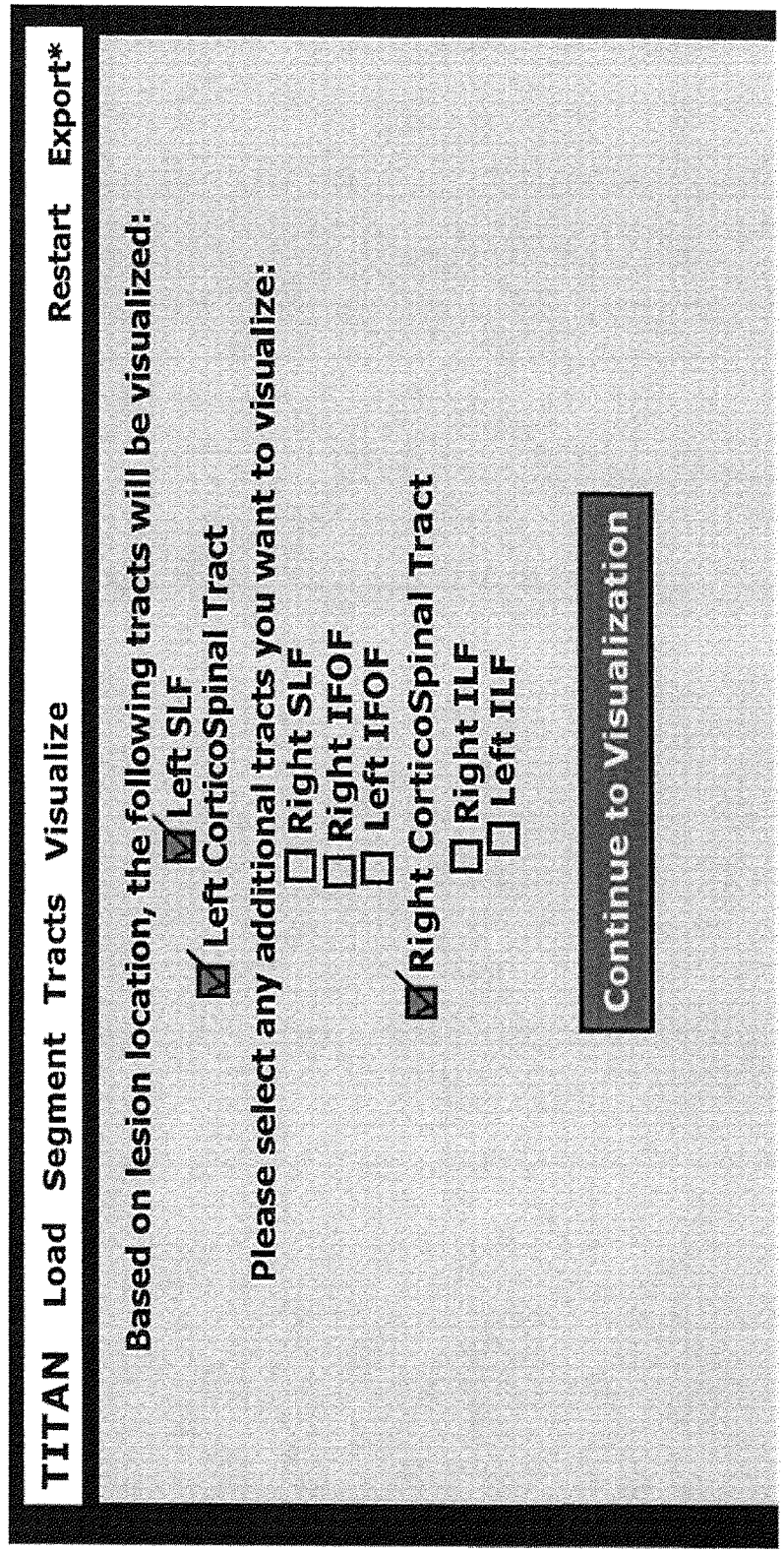
FIG. 5 is a pictorial description of the concept planning tool running inside a web browser. In this figure, XTK® software, duly modified using skill in the art to perform the methods described herein, is used to visualize WM tracts.
Figure 5B:
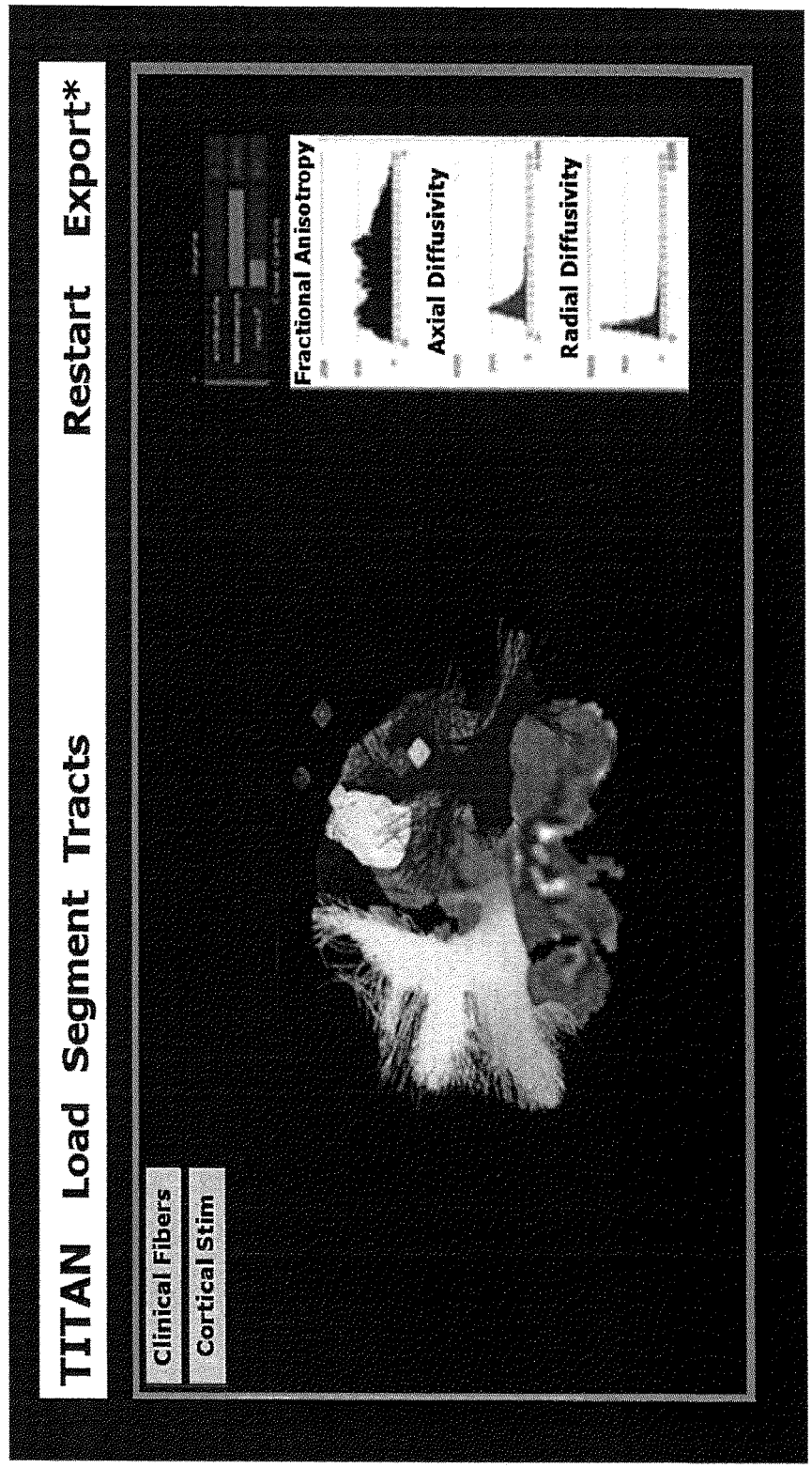

Additionally, the software may import STIM data. The user will have the ability to visualize the overlap between STIM sites and tractography results. The STIM sites will be displayed with a margin to incorporate possible inaccuracies due to correction for brain shift. Intra-operatively, this functionality will allow the surgeon to distinguish between true positive and false positive fiber tracts. In research, this functionality will enable continued validation and development of the 'ideal' tractography paradigm. Finally, to facilitate research, all tract data (fiber tracts, health map, quantitative tract data, etc.) will be made exportable. FIG. 5 shows some of the visualizations of the tool.

I. EMBODIMENTS

In one embodiment, an edema invariant tractography method is provided and includes (i) acquiring data from a patient using a 3-shell, high angular resolution diffusion imaging sequence, wherein the first shell as a b-value of about 300 s/mm$^2$ and a gradient direction of about 15, the second shell has a b-value of about 800 s/mm$^2$ and a gradient direction of about 30, and the third shell has a b-value of about 2000 s/mm$^2$ and a gradient direction of about 64; (ii) modeling the data using a multi-compartment model; and (iii) reconstructing the fibers through a probabilistic tracking algorithm using a fiber orientation distribution which has streamlines fitted to the output of the probabilistic tracking algorithm.

In another embodiment, an edema invariant tractography method is provided and includes (i) acquiring data from a patient using a multishell, high angular resolution diffusion imaging sequence; (ii) modeling the data using a multi-compartment model comprising a free water compartment; and (iii) reconstructing the fibers through a probabilistic tracking algorithm using a fiber orientation distribution which has streamlines fitted to the output of the probabilistic tracking algorithm.

In a further embodiment, a method of identifying tracts in an edematous brain of a patient is provided and includes (i) acquiring data from the patient using a 3-shell, high angular resolution diffusion imaging sequence, wherein the first shell as a b-value of about 300 s/mm$^2$ and a gradient direction of about 15, the second shell has a b-value of about 800 s/mm$^2$ and a gradient direction of about 30, and the third shell has a b-value of about 2000 s/mm$^2$ and a gradient direction of about 64; (ii) modeling the data using a multi-compartment model; and (iii) reconstructing the fibers through a probabilistic tracking algorithm using a fiber orientation distribution which has streamlines fitted to the output of the probabilistic tracking algorithm.

In yet another embodiment, a method of identifying tracts in an edematous brain of a patient is provided and includes (i) acquiring data from a patient using a multishell, high angular resolution diffusion imaging sequence; (ii) modeling the data using a multi-compartment model comprising a free water compartment; and (iii) reconstructing the fibers through a probabilistic tracking algorithm using a fiber orientation distribution which has streamlines fitted to the output of the probabilistic tracking algorithm.

In still a further embodiment, a tractography electronic device is provided and includes (a) code for performing a 3-shell, high angular resolution diffusion imaging sequence, wherein the first shell as a b-value of about 300 s/mm$^2$ and a gradient direction of about 15, the second shell has a b-value of about 800 s/mm$^2$ and a gradient direction of about 30, and the third shell has a b-value of about 2000 s/mm$^2$ and a gradient direction of about 64; (b) code for performing a multi-compartment model; (c) code for reconstructing the fibers through a probabilistic tracking algorithm using a fiber orientation distribution which has streamlines fitted to the output of the probabilistic tracking algorithm; and (d) at least one processing unit for executing the code of (a)-(c).

In another embodiment, a tractography electronic device is provided and includes (a) code for performing a multi-shell, high angular resolution diffusion imaging sequence; (b) code for performing a multi-compartment model comprising a free water compartment; (c) code for reconstructing the fibers through a probabilistic tracking algorithm using a fiber orientation distribution which has streamlines fitted to the output of the probabilistic tracking algorithm; and (d) at least one processing unit for executing the code of (a)-(c).

In a further embodiment, a tractography electronic device is provided and includes at least one processing unit configured to (i) acquire data using a 3-shell, high angular resolution diffusion imaging sequence, wherein the first shell as a b-value of about 300 s/mm$^2$ and a gradient direction of about 15, the second shell has a b-value of about 800 s/mm$^2$ and a gradient direction of about 30, and the third shell has a b-value of about 2000 s/mm$^2$ and a gradient direction of about 64; (ii) model the data using a multi-compartment model; and reconstruct the fibers through a probabilistic tracking algorithm using a fiber orientation distribution which has streamlines fitted to the output of the probabilistic tracking algorithm.

In still a further embodiment, a tractography electronic device is provided and includes at least one processing unit configured to (i) acquire data using a multishell, high angular resolution diffusion imaging sequence; (ii) model the data using a multi-compartment model comprising a free water compartment; and (iii) reconstruct the fibers through a probabilistic tracking algorithm using a fiber orientation distribution which has streamlines fitted to the output of the probabilistic tracking algorithm.

In yet another embodiment, a computer program product is provided, is stored on a computer readable medium, and includes instructions for configuring a computer to (i) acquire data using a 3-shell, high angular resolution diffusion imaging sequence, wherein the first shell as a b-value of about 300 s/mm$^2$ and a gradient direction of about 15, the second shell has a b-value of about 800 s/mm$^2$ and a gradient direction of about 30, and the third shell has a b-value of about 2000 s/mm$^2$ and a gradient direction of about 64; (ii) model the data using a multi-compartment model; and (iii) reconstruct the fibers through a probabilistic tracking algorithm using a fiber orientation distribution which has streamlines fitted to the output of the probabilistic tracking algorithm.

In a further embodiment, a computer program product is provided, is stored on a computer readable medium, the includes instructions for configuring a computer to (i) acquire data using a multishell, high angular resolution diffusion imaging sequence; (ii) model the data using a multi-compartment model comprising a free water compartment; and (iii) reconstruct the fibers through a probabilistic tracking algorithm using a fiber orientation distribution which has streamlines fitted to the output of t probabilistic tracking algorithm.

The following examples are illustrative only and are not intended to limit the present invention.

J. EXAMPLES

Example 1

Nine tumor patients having a glioblastoma multiforme or metastatic tumor that exhibited edema within an eloquent tract such as the arcuate fasciculus and corticospinal tract, brain was scanned and thereby evaluated using the novel methods described herein. Data was acquired using a Siemens Magentom® Trio, A Time System 3T MRI System (Siemens) and an MSMB sequence of a 3-shell acquisition with shells corresponding to b=300, 800, 2000 s/mm$^2$ (with 15, 30 and 64 gradient directions, respectively) and 7 non-diffusion weighted acquisitions. There are in total 116 gradient directions. The multiband acquisition took about 13 minutes.

MCM fitting was performed on the acquired and data and coding of the mathematical model described above using skill known in the art.

The acquired data was then processed using the tractography algorithm described above, e.g., see the section on TITAN™. The results are shown in FIG. 2. Specifically, FIG. 2 shows the comparison between the reconstruction of the CST using a DTI fit (with and without free correction), a high angular resolution diffusion imaging model without free correction and an MCM. Success was judged by expert determination of anatomical correctness. It was observed that while the high angular resolution diffusion imaging tracking was able to capture lateral fibers, the MCM with probabilistic tracking (FIG. 2E) produced the best tracking results despite the presence of edema. It obtained the lateral fibers of the CST better than the high angular resolution diffusion imaging-only model. Thus, these results show that in addition to fitting an MCM, the choice of the tracking algorithm is likewise crucial.

The tracking results were evaluated using cortical stimulation and compared with current clinical tools. STIM sites, recorded on the T1-image, were registered to the dMRI data using deformable registration following surface registration map provided by the surgical navigation system. The radius of the STIM sites were extended by 5 mm to obtain overlap between the STIM sites and reconstructed (volume rendered) tracts of CST are quantified. A radius around the STIM point was used to account for tissue shift as well as the propagation of the electrical current to nearby cortex.

Example 2

This example demonstrates that combining the free water component with a higher order diffusion model enables the tracking through edematous regions and is also resilient to mass effect.

A. Data Collection

The novel paradigm described herein was applied to the datasets for 2 patients of the MICCAI Tractography Challenge described in Lecoeur, 2013 cited above and 2013 (hereinafter the "Challenge") and incorporated by reference herein. The data comprised four shells, i.e., b=200, 500, 1000 and 3000 s/mm$^2$ respectively and a two-compartment model was fit to the data that combined edema correction with a fiber orientation distribution (FOD) scheme to create a new higher order diffusion model. This higher order diffusion model was then used for tracking the CST in the two patients with brain tumor. The tract was reconstructed using inclusion regions in the cerebral peduncle provided with the Challenge data, as well as regions defining the motor cortex segmented in the two subjects using an atlas.

The MCM discussed above designed with a free water compartment and a FOD was utilized to estimate diffusion directions in presence of edema. In the case of the Challenge data, there were 30 directions in the b=1000 and 3000 s/mm$^2$ shells; however, they are not independent of each other (the same gradient directions are replicated). The free water correction was applied only to the regions of edema, when such a map is available. A probabilistic streamline approach was then utilized (Tournier, International Journal of Imaging Systems and Technology, 2012) on the edema-free FODs, performed using Mrtrix™ software (Tournier, Neuroimage, vol. 23, pp. 1176-85, November 2004). For the Challenge data, the tractography was constrained by an FA mask that was thresholded at 0.15 and a radius of curvature threshold of 3 mm. FA was computed by fitting a tensor to the multishell data using DiPy™ software (Garyfallidis, 2014, Dipy, a library for the analysis of diffusion MRI data, Frontiers in Neuroinformatics, vol. 8, no. 8).

B. Data Validation

Figure 3A:
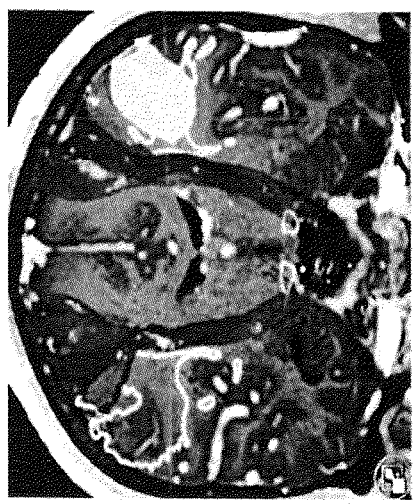
FIGS. 3A-3C are scans of created CST.
Figure 3B:
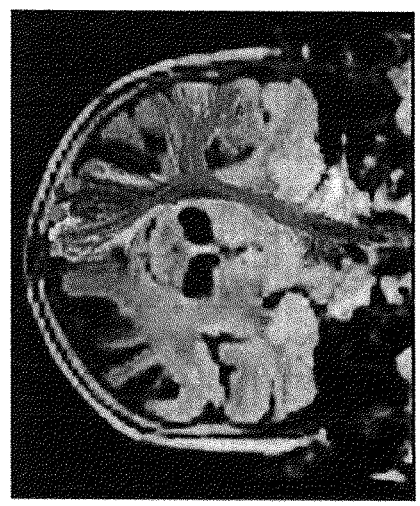
Figure 3C:
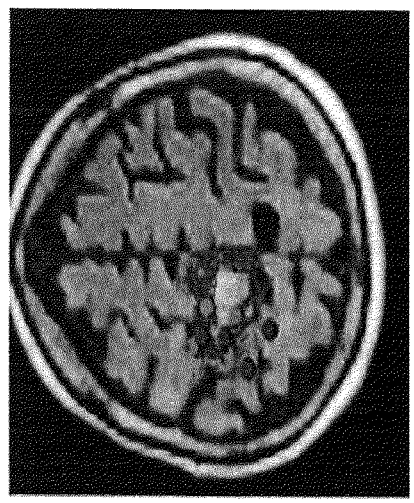

Cortical stimulation (STIM) was utilized to map the eloquent cortex with high spatial accuracy (Kim, Neurosurgery, 64: 836-45; discussion 345-6, 2009 and Sanai Neurosurgical focus, 28: E1, 2010). The STIM sites, recorded on the T1-image, were registered to the dMRI data using deformable registration following the surface registration map provided by the surgical navigation system. The output of a clinical software package was the compared with the tract (FIG. 3). The CST in the clinical software shows no lateral projections (FIG. 3A), however the functional activation indicates the presence of fibers in the hand and face area. These fibers are identified by tracking described herein (FIG. 3B), which shows a high overlap with the STIM points (FIG. 3C), as compared to that of the tract extracted by the clinical software. The tractography was validated on data from 3 of the 9 patients.

The ROI of the cerebral peduncles provided by the Challenge were utilized. The CST was reconstructed using the supplemental areas that are the pre-motor cortex and the post-central gyms. Work performed using only the pre-central gyms gave an incomplete answer about the location of the CST. Hence, instead of using the motor strip of the Challenge, that covered only the pre-central gyms, the motor cortex for each subject was segmented. The strip provided by the Challenge was utilized as a means of evaluating the results. Since this approach is a probabilistic streamline method, the motor cortex was split into 3 regions so each of the main regions of the CST (leg, arm and face) had equal probability of being reached. Using the Desikan Atlas (Augustinack, NeuroImage, 64: 32-42, 1002) on Eve template (Oishi, JHU-MNI-ss Atlas. JHU May 2010), the pre-central and post-central gyri and the pre-motor cortex in both hemispheres were retained and dilated that ROI into the adjacent white matter. This region was then cut in the three main regions of interest for each hemisphere (leg, arm and face). Fractional Anisotropy map of Eve was then utilized and each subject to perform a non-rigid registration. This deformation field was then applied to these ROIs to register them to the subject's diffusion space. FIG. 6 shows the ROIs on the template (FIG. 6A), patient (FIG. 6B) and patient 2 (FIG. 6C).

C. Results (i) Subject 1

Figure 8A:
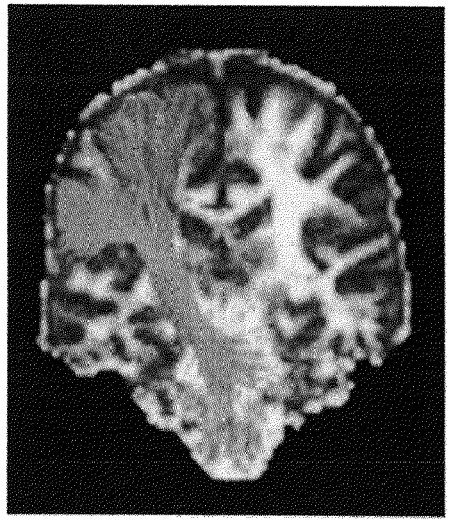
FIGS. 8A-8C are images of CST on the side of the tumor in subject 1.
Figure 8B:
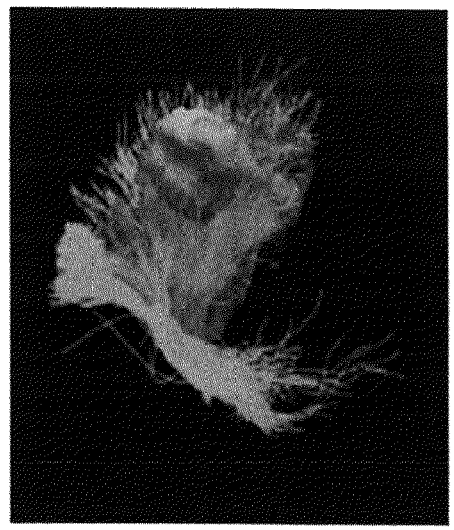

The CST was tracked in this subject by fitting the multi-compartment model to the data and tracking described and ROIs defined above. FIG. 7 shows the CST of the healthy side and FIG. 8 shows the CST of the side with the tumor. The motor strip provided with the Challenge data was displayed, as means of evaluating the overlap. Not only was the main trunk of the CST reconstructed, but also was the lateral projections to the hand and face area.

Figure 8C:
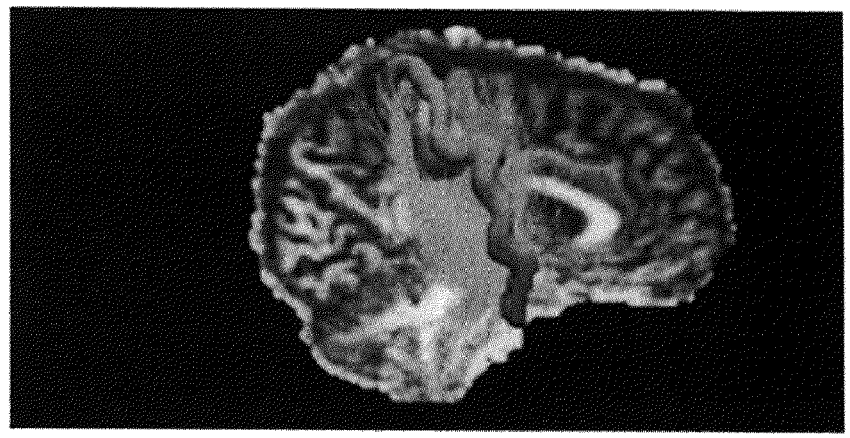

FIG. 8 shows the fibers of the affected CST traversing the edema region. The overlay with the Challenge motor strip (pre-central gyms) shows how the tracts are displaced to both sides of the strip as a result of the tumor. The results can be evaluated based on the overlap of the end points of the fibers with the pre-central gyms, which is shown FIG. 7B and in FIG. 8C. The overlap was visually evaluated to be high in the healthy side, and in parts of the strip away from the tumor, on the affected side.

(ii) Subject 2

Next, the tractography paradigm was applied to subject 2. FIGS. 10 and 11 show the results on the healthy side and the tumor side, respectively. As can be seen, the face, hand and foot region are well reconstructed in the CSTs on both the sides. In FIG. 9, there is a high overlap of the tracked fibers with the pre-central gyms (strip provided by the Challenge). FIG. 10 shows the tracking results in subject on the side of the tumor. Since the edema does not overlap a lot with the fibers, the challenge here was the presence of mass effect. The figure shows how the fibers of the affected CST proceed from the cerebral peduncle to the motor cortex, compressed around the PLIC.

(iii) Evaluation Criteria

The methods presented herein were validated using cortical stimulation data acquired on patients with brain tumor, with a multi-shell image acquisition. For the purposes of the Challenge, in the absence of ground truth, the results were evaluated based on the anatomical correctness of the results. It was also evaluated based on the overlap with the motor strip/pre-central gyms provided with the Challenge data. Since this strip was not used for the purposes of initiating the tracking, and instead used a separate segmentation of the motor cortex, this could be used as an independent evaluation criterion. As was seen in both the cases, there was high overlap of the fiber end points with this strip, on the side that was unaffected by the tumor.

D. Discussion

This example provided a tractography paradigm that has been designed for a multi-shell acquisition scheme. By fitting a multi-compartment model, the tractography paradigm accurately tracked through edematous, peritumoral brain regions, as well as regions of complex white matter like crossing fibers. The inventors hypothesized that in regions of edema there is an increase in the extra-cellular water content, but the underlying white matter fiber is still present/intact. This example showed that these tractography methods accounted for intra- and inter-cellular water and reconstructed white matter fiber in edematous brain regions.

The results presented on the two subjects demonstrate that the methods described herein enable tracking through edematous regions and are able to reconstruct the body of the CST, as well as the lateral projections. For the Challenge, in the absence of cortical stimulation data, the accuracy of tracts qualitatively was evaluated. The qualitative evaluation of the tracts was based on the anatomical correctness of the reconstructed tract, based on the overlap of the end points of fibers with the precentral gyrus/motor strip provided as part of the DTI Challenge dataset. As the reconstruction of the CST requires the modeling of regions with complex white matter (regions with crossing fibers) and turning (for the lateral fibers to the hand and face region), the high angular resolution diffusion imaging-based multi-compartment model was able to reconstruct the fibers. As can be seen, the methods permit retrieving CSTs that fan out to the whole extent of the motor cortex. The overlap with the motor strip was used as an independent evaluation criterion. Upon inspection of the results, there was a high overlap between the motor strip and the end points of the fibers, both on the unaffected and affected side. In subject 1, the tracts were displaced by the tumor, but the overlap is high in the regions away from the tumor. In subject 2, where the tumor affected the PLIC, the overlap with the entire motor strip was very high.

CITATIONS

Basser, Biophysical Journal, 66: 259-267, 1994
Basser, Journal of Magnetic Resonance, Series B, 103:247-54, March 1994
Descoteaux, INRIA Sophia Antipolis, 2008
Tournier, Neuroimage, 42:617-25, Aug. 15, 2008
Tuch, "Diffusion MRI of Complex Tissue Structure," Harvard University and Massachusetts Institute of Technology, 2002
Basser, Journal of Magnetic Resonance, Series B, 111:209-219, 1996
Basser, Magnetic Resonance in Medicine, 44: 625-632, 2000
Bihan, Neuroimage, November 2011
Abdullah, Neurosurgical focus, 34: E1, 2013
Golby, Neurosurgery, 68: 496-505, February 2011
Nimsky, Neurosurgery, 61: 178-85; discussion 186, 2007
Nimsky, World Neurosurgery, 2013
Duffau, World Neurosurgery, 81: 56-8, 2014
Bi, World Neurosurgery, Sep. 7, 2013
Lerner, World Neurosurgery, Aug. 3, 2013
Nimsky, Acta neurochirurgica. Supplement, 109: 207-14, 2011
American Brain Tumor Society, http://www.abta.org/about-us/news/brain-tumor-statistics/
Sawaya, Neurosurgery, 42: 1044-55; discussion 1055-6, 1998
Ganslandt, Neurology India, 50: 244-55, 2002
Lerner, World Neurosurgery, 2013
Tsolaki, World Journal of Radiology, 6: 72-81, 2014
Winston, Epilepsia, 52: 1430-8, 2011
Golby, Neurosurgery, 68: 496-505, 2011
Yamada, Magnetic Resonance in Medical Sciences, 8:165-74, 2009
Buchmann, Acta neurochirurgica, 153: 68-74; discussion 74, 2011
Bucci, NeuroImage Clinical, 3:361-8, 2013
Bello, NeuroImage, 39:369-82, 2008
Fernandez-Miranda, Neurosurgery, 71: 430-53, 2012
Clark, NeuroImage, 20:1601-8, 2003
Zhang, NeuroImage, 42: 771-7, 2008
Feigl, World Neurosurgery, 81: 144-50, January 2014
Smith, Journal of Clinical Oncology, 26: 1338-45, 2008
Sanai, Neurosurgery, 62:753-64; discussion 264-6, 2008
McGirt, Journal of Neurosurgery, 110: 156-62, 2009
Oppenlander, Journal of Neurosurgery, 120: 846-53, 2014
Marina, Journal of Neurosurgery, 115:220-9, 2011
Castellano, Neurooncology, 14: 192-202, 2012
Wu, Neurosurgery, 61:935-48; discussion 948-9, 2007
Girard, "Neurosurgical tracking at the Sherbrooke Connectivity Imaging Lab (SCIL)," presented at the MICCAI DTI Tractography Challenge, 2012
Kuhnt, PloS One, vol. 8, 2013
Duffau, World Neurosurgery, 2014
Farquharson, Journal of Neurosurgery, 118: 1367-77, 2013
Caruyer, "A comparative study of 16 tractography algorithms for the corticospinal tract: reproducibility and subject-specificity," in ISMRM, 2014
Feigl, World Neurosurgery, 81: 144-50, 2014
Wang, NeuroImage, 60:1127-38, 2012
Le Bihan, Journal of Magnetic Resonance Imaging, 24:478-88, 2006
Pasternak, "Estimation of extracellular volume from regularized multi-shell diffusion mri," presented at the Med Image Comput Comput Assist Interv. MICCAI, 2012
Zhang, NeuroImage, 61: 1000-16, 2012
Pasternak, Journal of the Society of Magnetic Resonance in Medicine, 62: 717-30, 2009
Scherrer, 16: 518-26, 2013
Assaf, NeuroImage, 27: 48-58, 2005
Fedorov, Magnetic Resonance Imaging, 30: 1323-41, 2012
Trackvis, www.trackvis.org
Tournier, International Journal of Imaging Systems and Technology, 22: 53-66, 2012
Cook, "Camino: Open-Source Diffusion-MRI Reconstruction and Processing," in Scientific Meeting of the International Society for Magnetic Resonance in Medicine, ed, p. 2759, 2006
Xu, NeuroImage, 83: 991-1001, 2013
Tuch, Neuron, 40: 885-95, Dec. 4, 2003
Tuch, Magnetic Resonance in Medicine, 52: 1358-1372, 2004
Tournier, Neuroimage, 23: 1176-85, November 2004
Descoteaux, Magnetic Resonance Medicine, 58: 497-510, September 2007
Descoteaux, Information Processing in Medical Imaging, 21: 1-13, 2009
Descoteaux, Medical Image Analysis, 15: 603-621, 2011
Descoteaux, IEEE Trans Med Imaging, 28: 269-286, February 2009
Bloy, Brain Connectivty, 2(2):69-79, 2012
Tournier, Neuroimage, 35: 1459-72, May 1, 2007
Andersen, 2013, CVXOPT: A Python package for convex optimization, version 1.1.6. Available at cvxopt.org
Caruyer, Magnetic Resonance in Medicine, 69:1534-40, 2013
Scherrer, Proc. IEEE Int Biomedical Imaging: From Nano to Macro Symp, pp. 1389-1392, 2010
Human Connectome Project, http://www.humanconnectomeproject.org/
Roine, Frontiers in Neuroinformatics, 8: 28, 2014
Dell'acqua, NeuroImage, 49:1446-58, 2010
Lecoeur, "Improving White Matter Tractography by Resolving the Challenges of Edema," in MICCAI workshop: DTI Challenge 2013, Nagoya, Japan, 2013

Macyszyn, "Tractography for Neurosurgeons: Automating tract extraction and resolving the challenges of edema," presented at the EANS (European Conference for Neurosurgery), Prague, 2014

Mandelli, Journal of Neurosurgery, 121(2):349-358, August 2014

Kim, Neurosurgery, 64: 836-45; discussion 345-6, 2009

Sanai, Neurosurgical Focus, 28: E1, 2010

Jones, NeuroImage, 73:239-54, 2013

The X Toolkit: WebGL™ for Scientific Visualization, http://www.goXTK.com

Gooya, IEEE Trans Med Imaging, 31: 1941-54, October 2012

All publications cited in this specification, including those specifically recited below, and U.S. Provisional Patent Application No. 62/047,980, filed Sep. 9, 2014, are incorporated herein by reference. While the invention has been described with reference to particular embodiments, it will be appreciated that modifications can be made without departing from the spirit of the invention. Such modifications are intended to fall within the scope of the appended claims.

What is claimed is:

1. An edema invariant tractography method comprising, with a processor:
   (i) acquiring data from a patient suspected of having edema using a 3-shell, high angular resolution diffusion imaging sequence, wherein:
      the first shell has a b-value of about 300 s/mm² and a gradient direction of about 15, the second shell has a b-value of about 800 s/mm² and a gradient direction of about 30, and the third shell has a b-value of about 2000 s/mm² and a gradient direction of about 64;
   (ii) modeling said data using a multi-compartment model; and
   (iii) reconstructing fibers through a probabilistic tracking algorithm using a fiber orientation distribution which has streamlines fitted to the output of said probabilistic tracking algorithm,
   wherein the method is invariant to the presence of increased free water in the patient and provides fiber tracking in either the presence or absence of free water.

2. The method according to claim 1, wherein said multi-compartment model estimates diffusion directions and the amount of extra-cellular water in the presence of edema.

3. The method according to claim 1, wherein said multi-compartment model estimates underlying fiber tract visualizations in the presence of said edema.

4. The method according to claim 1, which comprises at least about 7 non-diffusion weighted acquisitions.

5. The method according to claim 1, wherein said multi-compartment model is:

$$s_k = f s_o^w \exp(-b_k d_o^w) + (1-f) FOD * FIR(b_k, u_k)$$

wherein:
   $s_k$=measured signal intensity corresponding to k-th diffusion gradient;
   $u_k$=direction corresponding to k-th diffusion gradient;
   $b_k$=b-value corresponding to k-th diffusion gradient;
   $f$=volume fraction and baseline signal intensity of the FW compartment;
   $s_o^w$=volume fraction and baseline signal intensity of the FW compartment;
   $d_0^w$=FW diffusion coefficient;
   FOD=fiber orientation distribution;
   FIR=fiber impulse response; and
   *=convolution operator.

6. The method according to claim 5, wherein said FIR is estimated by fitting a DTI-model to the data and identifying voxels with FA>0.7 as single fiber voxels.

7. The method according to claim 5, wherein $s_0^w$ is estimated using a CSF map from a tumor growth model or segmentation map.

8. The method according to claim 5, wherein said FOD and the volume fraction f are estimated using the following equation:

$$\hat{f}, \hat{c} = \arg\min |s - (f s_w + (1-f) HR_c)|^2$$

wherein:
   $0 \leq f \leq 1$;
   $B_c \geq 0$;
   $s_w$=signal from FW compartment;
   H=spherical harmonics observation matrix;
   R=convolution operator computed from FIR;
   c=spherical harmonic representation of FOD; and
   B=spherical harmonics evaluated on points on which positive constraint is imposed.

9. The method according to claim 1, wherein the reconstruction comprises white matter tracts.

10. The method according to claim 9, wherein the reconstruction comprises diffusion measures associated with said tracts.

11. The method according to claim 1, wherein the reconstruction comprises high curvature fibers.

12. The method according to claim 11, wherein said high curvature fibers comprise the lateral projections of the cortico-spinal tract, arcuate fasciculus, Meyer's loop of optic radiation, or combinations thereof.

13. The method according to claim 1, wherein the reconstruction comprises crossing fibers.

14. The method according to claim 4, which comprises 7 non-diffusion weighted acquisitions.

15. The method according to claim 1, which is performed on the brain of said patient.

16. The method according to claim 1, which is performed in the absence of manually designating a region of interest.

17. The method according to claim 1, which may be utilized to improve resecting a tumor from the brain of said patient.

18. An edema invariant tractography method comprising, with a processor:
   (i) acquiring data from a patient suspected of having edema using a multishell, high angular resolution diffusion imaging sequence using b-values which are sensitive to free water diffusion and which provide enhanced angular resolution, wherein said multishell sequence comprises at least three shells, wherein a first shell has a b-value in the range of about 10 s/mm² to about 400 s/mm²;
   (ii) modeling said data using a multi-compartment model comprising a first compartment which is a free water compartment which corrects for edema and a second compartment which models anisotropic diffusion within and around axons; and
   (iii) reconstructing fibers through a probabilistic tracking algorithm using a fiber orientation distribution which has streamlines fitted to the output of said probabilistic tracking algorithm
   wherein the method is invariant to the presence of increased free water in the patient and provides fiber tracking in either the presence or absence of free water.

19. The method according to claim 18, wherein said multicompartment model further comprises a fiber orientation distribution.

20. The method according to claim 18, wherein said multishell multiband image acquisition comprises a 3 to 6 shell acquisition.

21. The method according to claim 20, wherein the first shell has a b-value of about 10 to about 400 s/mm$^2$ and further comprises a gradient direction of about 7 to about 100, the second shell has a b-value of about 400 to 1000 s/mm$^2$ and a gradient direction of about 10 to about 80, and the third shell has a b-value of about 1500 to about 5000 s/mm$^2$ and a gradient direction of about 25 to about 128.

22. The method according to claim 21, wherein the first shell as a b-value of about 300 s/mm$^2$ and a gradient direction of about 15, the second shell has a b-value of about 800 s/mm$^2$ and a gradient direction of about 30, and the third shell has a b-value of about 2000 s/mm$^2$ and a gradient direction of about 64.

23. The method according to claim 18, wherein said multishell multiband image acquisition comprises a 3 shell acquisition.

24. A method of identifying tracts in an edematous brain of a patient, said method comprising, with a processor:
  (i) acquiring data from said patient using a 3-shell, high angular resolution diffusion imaging sequence, wherein:
    the first shell as a b-value of about 300 s/mm$^2$ and a gradient direction of about 15, the second shell has a b-value of about 800 s/mm$^2$ and a gradient direction of about 30, and the third shell has a b-value of about 2000 s/mm$^2$ and a gradient direction of about 64;
  (ii) modeling said data using a multi-compartment model; and
  (iii) reconstructing fibers through a probabilistic tracking algorithm using a fiber orientation distribution which has streamlines fitted to the output of said probabilistic tracking algorithm, wherein the method is invariant to the presence of increased free water in the patient and provides fiber tracking in either the presence or absence of free water.

25. The method according to claim 24, which identifies crossing fibers in the brain of said patient.

26. The method according to claim 24, wherein the white matter of said brain is analyzed.

27. The edema invariant method according to claim 24, which tracks through the white matter of said brain to produce fiber tract visualizations.

28. The method according to claim 24, wherein a tumor is present in said brain.

29. The method according to claim 28, wherein peritumoral regions are analyzed.

30. The method according to claim 24, wherein the edema results from a tumor, low blood sodium, multiple sclerosis, an injury, blood clot, infection, hemorrhage, high altitudes, or combinations thereof.

31. The method according to claim 30, wherein said infection comprises meningitis, encephalitis, toxoplasmosis, subdural empyem, or combinations thereof.

32. A method of identifying tracts in an edematous brain of a patient, said method comprising, with a processor:
  (i) acquiring data from the patient using a multishell, high angular resolution diffusion imaging sequence using b-values which are sensitive to free water diffusion and which provide enhanced angular resolution, wherein said multishell sequence comprises at least three shells, wherein a first shell has a b-value in the range of about 10 s/mm$^2$ to about 400 s/mm$^2$;
  (ii) modeling said data using a multi-compartment model comprising a first compartment which is a free water compartment which corrects for edema and a second compartment which models anisotropic diffusion within and around axons;
  (iii) reconstructing fibers through a probabilistic tracking algorithm using a fiber orientation distribution which has streamlines fitted to the output of said probabilistic tracking algorithm, wherein the method is invariant to the presence of increased free water in the patient and provides fiber tracking in either the presence or absence of free water.

33. A tractography electronic device, said device comprising at least one processing unit configured to:
  acquire data from a patient suspected of having edema using a multishell, high angular resolution diffusion imaging sequence using b-values which are sensitive to free water diffusion and which provide enhanced angular resolution, wherein said multishell sequence comprises at least three shells, wherein a first shell has a b-value in the range of about 10 s/mm$^2$ to about 400 s/mm$^2$;
  model said data using a multi-compartment model comprising a free water compartment; and
  reconstruct fibers through a probabilistic tracking algorithm using a fiber orientation distribution which has streamlines fitted to the output of said probabilistic tracking algorithm, wherein the product provides invariant fiber tracking in either the presence or absence of free water.

34. A computer program product, stored on a computer readable medium, said product comprising instructions for configuring a computer to:
  acquire data from a patient suspected of having edema using a 3-shell, high angular resolution diffusion imaging sequence, wherein:
    the first shell as a b-value of about 300 s/mm$^2$ and a gradient direction of about 15, the second shell has a b-value of about 800 s/mm$^2$ and a gradient direction of about 30, and the third shell has a b-value of about 2000 s/mm$^2$ and a gradient direction of about 64;
  model said data using a multi-compartment model; and
  reconstruct fibers through a probabilistic tracking algorithm using a fiber orientation distribution which has streamlines fitted to the output of said probabilistic tracking algorithm, wherein the product provides invariant fiber tracking in either the presence or absence of free water.

* * * * *